US008228725B2

(12) United States Patent
Forbes et al.

(10) Patent No.: US 8,228,725 B2
(45) Date of Patent: *Jul. 24, 2012

(54) MEMORY UTILIZING OXIDE NANOLAMINATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/790,625

(22) Filed: May 28, 2010

(65) Prior Publication Data

US 2010/0244122 A1    Sep. 30, 2010

Related U.S. Application Data

(60) Continuation of application No. 12/205,338, filed on Sep. 5, 2008, now Pat. No. 7,728,626, which is a division of application No. 11/458,854, filed on Jul. 20, 2006, now Pat. No. 7,433,237, which is a continuation of application No. 10/190,717, filed on Jul. 8, 2002, now Pat. No. 7,221,586.

(51) Int. Cl.
*G11C 16/00* (2006.01)
*G11C 16/02* (2006.01)
*G11C 16/04* (2006.01)
*H01L 29/792* (2006.01)

(52) U.S. Cl. .............. 365/184; 365/185.05; 365/185.03; 365/51; 365/63; 365/72; 257/324

(58) Field of Classification Search ............. 365/185.03, 365/185.05, 51, 63, 72, 184; 257/324, 325, 257/760

See application file for complete search history.

(56) References Cited

U.S. PATENT DOCUMENTS

| 3,357,961 A | 12/1967 | Makowski et al. |
| 3,381,114 A | 4/1968 | Nakanuma |
| 3,641,516 A | 2/1972 | Casrucci et al. |
| 3,665,423 A | 5/1972 | Nakamuma et al. |
| 3,877,054 A | 4/1975 | Boulin et al. |
| 3,918,033 A | 11/1975 | Case et al. |
| 3,964,085 A | 6/1976 | Kahng et al. |
| 3,978,577 A | 9/1976 | Bhattacharyya et al. |
| 4,058,430 A | 11/1977 | Suntola et al. |

(Continued)

FOREIGN PATENT DOCUMENTS

EP    0540993 A1    5/1993

(Continued)

OTHER PUBLICATIONS

"International Technology for Semiconductor Roadmap, 1999 edition", Semiconductor Industry Association, [Online]. Retrieved from the Internet: <URL: http://public.itrs.net/Files/2001ITRS/Links/1999_SIA_Roadmap/>, (1999), 371 pgs.

(Continued)

*Primary Examiner* — J. H. Hur
(74) *Attorney, Agent, or Firm* — Schwegman, Lundberg & Woessner, P.A.

(57) ABSTRACT

Structures, systems and methods for transistors utilizing oxide nanolaminates are provided. One transistor embodiment includes a first source/drain region, a second source/drain region, and a channel region therebetween. A gate is separated from the channel region by a gate insulator. The gate insulator includes oxide insulator nanolaminate layers with charge trapping in potential wells formed by different electron affinities of the insulator nanolaminate layers.

18 Claims, 12 Drawing Sheets

U.S. PATENT DOCUMENTS

| | | |
|---|---|---|
| 4,152,627 A | 5/1979 | Priel et al. |
| 4,173,791 A | 11/1979 | Bell |
| 4,215,156 A | 7/1980 | Dalal et al. |
| 4,217,601 A | 8/1980 | DeKeersmaecker et al. |
| 4,295,150 A | 10/1981 | Adam |
| 4,333,808 A | 6/1982 | Bhattacharyya et al. |
| 4,394,673 A | 7/1983 | Thompson et al. |
| 4,399,424 A | 8/1983 | Rigby |
| 4,412,902 A | 11/1983 | Michikami et al. |
| 4,413,022 A | 11/1983 | Suntola et al. |
| 4,449,205 A | 5/1984 | Hoffman |
| 4,488,262 A | 12/1984 | Basire et al. |
| 4,495,219 A | 1/1985 | Kato et al. |
| 4,507,673 A | 3/1985 | Aoyama et al. |
| 4,590,042 A | 5/1986 | Drage |
| 4,647,947 A | 3/1987 | Takeoka et al. |
| 4,661,833 A | 4/1987 | Mizutani |
| 4,717,943 A | 1/1988 | Wolf et al. |
| 4,725,877 A | 2/1988 | Brasen et al. |
| 4,757,360 A | 7/1988 | Faraone et al. |
| 4,767,641 A | 8/1988 | Kieser et al. |
| 4,780,424 A | 10/1988 | Holler |
| 4,791,604 A | 12/1988 | Lienau et al. |
| 4,794,565 A | 12/1988 | Wu et al. |
| 4,829,482 A | 5/1989 | Owen |
| 4,870,470 A | 9/1989 | Bass, Jr. et al. |
| 4,888,733 A | 12/1989 | Mobley |
| 4,920,071 A | 4/1990 | Thomas |
| 4,939,559 A | 7/1990 | DiMaria et al. |
| 4,993,358 A | 2/1991 | Mahawili |
| 5,006,192 A | 4/1991 | Deguchi |
| 5,016,215 A | 5/1991 | Tigelaar |
| 5,017,977 A | 5/1991 | Richardson |
| 5,021,999 A | 6/1991 | Kohda et al. |
| 5,027,171 A | 6/1991 | Reedy et al. |
| 5,032,545 A | 7/1991 | Doan et al. |
| 5,042,011 A | 8/1991 | Casper et al. |
| 5,043,946 A | 8/1991 | Yamauchi et al. |
| 5,049,516 A | 9/1991 | Arima |
| 5,055,319 A | 10/1991 | Bunshah et al. |
| 5,071,782 A | 12/1991 | Mori |
| 5,073,519 A | 12/1991 | Rodder |
| 5,080,928 A | 1/1992 | Klinedinst et al. |
| 5,089,084 A | 2/1992 | Chhabra et al. |
| 5,111,430 A | 5/1992 | Morie |
| 5,198,029 A | 3/1993 | Dutta et al. |
| 5,253,196 A | 10/1993 | Shimabukuro |
| 5,274,249 A | 12/1993 | Xi et al. |
| 5,280,205 A | 1/1994 | Green et al. |
| 5,293,560 A | 3/1994 | Harari |
| 5,298,447 A | 3/1994 | Hong |
| 5,302,461 A | 4/1994 | Anthony |
| 5,303,182 A | 4/1994 | Nakao et al. |
| 5,317,535 A | 5/1994 | Talreja et al. |
| 5,332,915 A | 7/1994 | Shimoji et al. |
| 5,350,738 A | 9/1994 | Hase et al. |
| 5,388,069 A | 2/1995 | Kokubo |
| 5,391,510 A | 2/1995 | Hsu et al. |
| 5,399,516 A | 3/1995 | Bergendahl et al. |
| 5,409,859 A | 4/1995 | Glass et al. |
| 5,410,504 A | 4/1995 | Ward |
| 5,418,389 A | 5/1995 | Watanabe |
| 5,424,993 A | 6/1995 | Lee et al. |
| 5,426,603 A | 6/1995 | Nakamura et al. |
| 5,430,670 A | 7/1995 | Rosenthal |
| 5,434,815 A | 7/1995 | Smarandoiu et al. |
| 5,438,544 A | 8/1995 | Makino |
| 5,445,984 A | 8/1995 | Hong et al. |
| 5,449,941 A | 9/1995 | Yamazaki et al. |
| 5,455,792 A | 10/1995 | Yi |
| 5,457,649 A | 10/1995 | Eichman et al. |
| 5,467,306 A | 11/1995 | Kaya et al. |
| 5,477,485 A | 12/1995 | Bergemont et al. |
| 5,485,422 A | 1/1996 | Bauer et al. |
| 5,488,243 A | 1/1996 | Tsuruta et al. |
| 5,493,140 A | 2/1996 | Iguchi |
| 5,497,494 A | 3/1996 | Combs et al. |
| 5,498,558 A | 3/1996 | Kapoor |
| 5,508,543 A | 4/1996 | Hartstein et al. |
| 5,508,544 A | 4/1996 | Shah |
| 5,510,278 A | 4/1996 | Nguyen et al. |
| 5,522,932 A | 6/1996 | Wong et al. |
| 5,530,581 A | 6/1996 | Cogan |
| 5,530,668 A | 6/1996 | Chern et al. |
| 5,539,279 A | 7/1996 | Takeuchi et al. |
| 5,541,871 A | 7/1996 | Nishimura et al. |
| 5,541,872 A | 7/1996 | Lowrey et al. |
| 5,550,770 A | 8/1996 | Kuroda |
| 5,557,569 A | 9/1996 | Smayling et al. |
| 5,562,952 A | 10/1996 | Nakahigashi et al. |
| 5,572,052 A | 11/1996 | Kashihara et al. |
| 5,572,459 A | 11/1996 | Wilson et al. |
| 5,595,606 A | 1/1997 | Fujikawa et al. |
| 5,600,587 A | 2/1997 | Koike |
| 5,600,592 A | 2/1997 | Atsumi et al. |
| 5,602,777 A | 2/1997 | Nawaki et al. |
| 5,614,026 A | 3/1997 | Williams |
| 5,617,351 A | 4/1997 | Bertin et al. |
| 5,618,575 A | 4/1997 | Peter |
| 5,619,642 A | 4/1997 | Nielsen et al. |
| 5,621,681 A | 4/1997 | Moon |
| 5,621,683 A | 4/1997 | Young |
| 5,625,233 A | 4/1997 | Cabral, Jr. et al. |
| 5,627,781 A | 5/1997 | Hayashi et al. |
| 5,627,785 A | 5/1997 | Gilliam et al. |
| 5,646,430 A | 7/1997 | Kaya et al. |
| 5,646,583 A | 7/1997 | Seabury et al. |
| 5,670,790 A | 9/1997 | Katoh et al. |
| 5,674,563 A | 10/1997 | Tarui et al. |
| 5,674,574 A | 10/1997 | Atwell et al. |
| 5,677,867 A | 10/1997 | Hazani |
| 5,691,230 A | 11/1997 | Forbes |
| 5,698,022 A | 12/1997 | Glassman et al. |
| 5,714,766 A | 2/1998 | Chen et al. |
| 5,735,960 A | 4/1998 | Sandhu et al. |
| 5,740,104 A | 4/1998 | Forbes |
| 5,744,374 A | 4/1998 | Moon |
| 5,745,334 A | 4/1998 | Hoffarth et al. |
| 5,751,021 A | 5/1998 | Teraguchi |
| 5,754,477 A | 5/1998 | Forbes |
| 5,756,404 A | 5/1998 | Friedenreich et al. |
| 5,768,192 A | 6/1998 | Eitan |
| 5,789,030 A | 8/1998 | Rolfson |
| 5,795,808 A | 8/1998 | Park |
| 5,801,105 A | 9/1998 | Yano et al. |
| 5,801,401 A | 9/1998 | Forbes |
| 5,801,993 A | 9/1998 | Choi |
| 5,810,923 A | 9/1998 | Yano et al. |
| 5,822,256 A | 10/1998 | Bauer et al. |
| 5,825,064 A | 10/1998 | Hayashi et al. |
| 5,827,571 A | 10/1998 | Lee et al. |
| 5,828,080 A | 10/1998 | Yano et al. |
| 5,828,605 A | 10/1998 | Peng et al. |
| 5,840,897 A | 11/1998 | Kirlin et al. |
| 5,852,306 A | 12/1998 | Forbes |
| 5,856,688 A | 1/1999 | Lee et al. |
| 5,856,943 A | 1/1999 | Jeng |
| 5,880,991 A | 3/1999 | Hsu et al. |
| 5,886,368 A | 3/1999 | Forbes et al. |
| 5,891,773 A | 4/1999 | Saitoh |
| 5,912,488 A | 6/1999 | Kim et al. |
| 5,912,797 A | 6/1999 | Schneemeyer et al. |
| 5,916,365 A | 6/1999 | Sherman |
| 5,923,056 A | 7/1999 | Lee et al. |
| 5,936,274 A | 8/1999 | Forbes et al. |
| 5,943,262 A | 8/1999 | Choi |
| 5,950,925 A | 9/1999 | Fukunaga et al. |
| 5,952,692 A | 9/1999 | Nakazato et al. |
| 5,959,896 A | 9/1999 | Forbes |
| 5,963,476 A | 10/1999 | Hung et al. |
| 5,963,833 A | 10/1999 | Thakur |
| 5,972,847 A | 10/1999 | Feenstra et al. |
| 5,973,356 A | 10/1999 | Noble et al. |
| 5,981,335 A | 11/1999 | Chi |
| 5,981,350 A | 11/1999 | Geusic et al. |
| 5,986,932 A | 11/1999 | Ratnakumar et al. |
| 5,989,958 A | 11/1999 | Forbes |

| | | | | | | |
|---|---|---|---|---|---|---|
| 5,991,225 A | 11/1999 | Forbes et al. | | 6,238,976 B1 | 5/2001 | Noble et al. |
| 5,994,240 A | 11/1999 | Thakur | | 6,243,300 B1 | 6/2001 | Sunkavalli |
| 6,005,790 A | 12/1999 | Chan et al. | | 6,246,606 B1 | 6/2001 | Forbes et al. |
| 6,010,969 A | 1/2000 | Vaartstra | | 6,248,626 B1 | 6/2001 | Kumar et al. |
| 6,011,725 A | 1/2000 | Eitan | | 6,248,628 B1 * | 6/2001 | Halliyal et al. ............... 438/257 |
| 6,013,553 A | 1/2000 | Wallace et al. | | 6,249,020 B1 | 6/2001 | Forbes et al. |
| 6,020,024 A | 2/2000 | Maiti et al. | | 6,249,460 B1 | 6/2001 | Forbes et al. |
| 6,025,225 A | 2/2000 | Forbes et al. | | 6,252,793 B1 | 6/2001 | Allen et al. |
| 6,025,228 A | 2/2000 | Ibok et al. | | 6,255,683 B1 | 7/2001 | Radens et al. |
| 6,025,627 A | 2/2000 | Forbes et al. | | 6,258,637 B1 | 7/2001 | Wilk et al. |
| 6,027,961 A | 2/2000 | Maiti et al. | | 6,269,023 B1 | 7/2001 | Derhacobian et al. |
| 6,031,263 A | 2/2000 | Forbes et al. | | 6,273,951 B1 | 8/2001 | Vaartstra |
| 6,034,882 A | 3/2000 | Johnson et al. | | 6,281,144 B1 | 8/2001 | Cleary et al. |
| 6,040,243 A | 3/2000 | Li et al. | | 6,288,419 B1 | 9/2001 | Prall et al. |
| 6,049,479 A | 4/2000 | Thurgate et al. | | 6,290,491 B1 | 9/2001 | Shahvandi et al. |
| 6,057,271 A | 5/2000 | Kenjiro et al. | | 6,291,886 B1 | 9/2001 | Wallace et al. |
| 6,059,885 A | 5/2000 | Ohashi et al. | | 6,294,813 B1 | 9/2001 | Forbes et al. |
| 6,069,380 A | 5/2000 | Chou et al. | | 6,297,516 B1 | 10/2001 | Forrest et al. |
| 6,069,816 A | 5/2000 | Nishimura | | 6,297,539 B1 | 10/2001 | Ma et al. |
| 6,072,209 A | 6/2000 | Noble et al. | | 6,300,203 B1 | 10/2001 | Buynoski et al. |
| 6,090,636 A | 7/2000 | Geusic et al. | | 6,300,255 B1 | 10/2001 | Venkataranan et al. |
| 6,093,944 A | 7/2000 | VanDover | | 6,302,964 B1 | 10/2001 | Umotoy et al. |
| 6,101,131 A | 8/2000 | Chang | | 6,303,481 B2 | 10/2001 | Park |
| 6,104,045 A | 8/2000 | Forbes et al. | | 6,303,500 B1 | 10/2001 | Jiang et al. |
| 6,110,529 A | 8/2000 | Gardiner et al. | | 6,307,775 B1 | 10/2001 | Forbes et al. |
| 6,111,788 A | 8/2000 | Chen et al. | | 6,310,376 B1 | 10/2001 | Ueda et al. |
| 6,114,252 A | 9/2000 | Donohoe et al. | | 6,313,035 B1 | 11/2001 | Sandhu et al. |
| 6,115,281 A | 9/2000 | Aggarwal et al. | | 6,313,518 B1 | 11/2001 | Ahn et al. |
| 6,115,401 A | 9/2000 | Scobey et al. | | 6,317,357 B1 | 11/2001 | Forbes |
| 6,120,531 A | 9/2000 | Zhou et al. | | 6,320,784 B1 | 11/2001 | Muralidhar et al. |
| 6,122,201 A | 9/2000 | Lee et al. | | 6,320,786 B1 | 11/2001 | Chang et al. |
| 6,124,729 A | 9/2000 | Noble et al. | | 6,323,844 B1 | 11/2001 | Yeh et al. |
| 6,125,062 A | 9/2000 | Ahn et al. | | 6,330,184 B1 | 12/2001 | White et al. |
| 6,127,227 A | 10/2000 | Lin et al. | | 6,331,465 B1 | 12/2001 | Forbes et al. |
| 6,127,287 A | 10/2000 | Hurley et al. | | 6,337,805 B1 | 1/2002 | Forbes et al. |
| 6,134,175 A | 10/2000 | Forbes et al. | | 6,342,445 B1 | 1/2002 | Marsh |
| 6,140,181 A | 10/2000 | Forbes et al. | | 6,348,386 B1 | 2/2002 | Gilmer |
| 6,141,237 A | 10/2000 | Eliason et al. | | 6,349,062 B1 | 2/2002 | Thurgate |
| 6,141,238 A | 10/2000 | Forbes et al. | | 6,351,411 B2 | 2/2002 | Forbes et al. |
| 6,141,248 A | 10/2000 | Forbes et al. | | 6,353,554 B1 | 3/2002 | Banks |
| 6,141,260 A | 10/2000 | Ahn et al. | | 6,365,470 B1 | 4/2002 | Maeda |
| 6,143,636 A | 11/2000 | Forbes et al. | | 6,365,519 B2 | 4/2002 | Kraus et al. |
| 6,150,188 A | 11/2000 | Geusic et al. | | 6,368,398 B2 | 4/2002 | Vaartstra |
| 6,150,687 A | 11/2000 | Noble et al. | | 6,368,518 B1 | 4/2002 | Vaartstra |
| 6,153,261 A * | 11/2000 | Xia et al. ............... 427/255.393 | | 6,368,941 B1 | 4/2002 | Chen et al. |
| 6,153,468 A | 11/2000 | Forbes et al. | | 6,377,070 B1 | 4/2002 | Forbes |
| 6,154,280 A | 11/2000 | Borden | | 6,380,579 B1 | 4/2002 | Nam et al. |
| 6,157,061 A | 12/2000 | Kawata | | 6,381,168 B2 | 4/2002 | Forbes |
| 6,160,739 A | 12/2000 | Wong | | 6,387,712 B1 | 5/2002 | Yano et al. |
| 6,161,500 A | 12/2000 | Kopacz et al. | | 6,391,769 B1 | 5/2002 | Lee et al. |
| 6,163,049 A | 12/2000 | Bui | | 6,399,979 B1 | 6/2002 | Noble et al. |
| 6,166,401 A | 12/2000 | Forbes | | 6,407,435 B1 * | 6/2002 | Ma et al. ........................ 257/411 |
| 6,169,306 B1 | 1/2001 | Gardner et al. | | 6,418,050 B1 | 7/2002 | Forbes |
| 6,171,900 B1 | 1/2001 | Sun | | 6,420,230 B1 | 7/2002 | Derderian et al. |
| 6,172,397 B1 | 1/2001 | Oonakado et al. | | 6,420,279 B1 | 7/2002 | Ono et al. |
| 6,184,146 B1 | 2/2001 | Donohoe et al. | | 6,424,001 B1 | 7/2002 | Forbes et al. |
| 6,185,122 B1 | 2/2001 | Johnson et al. | | 6,429,063 B1 | 8/2002 | Eitan |
| 6,187,484 B1 | 2/2001 | Glass et al. | | 6,429,065 B2 | 8/2002 | Forbes |
| 6,191,448 B1 | 2/2001 | Forbes et al. | | 6,432,779 B1 | 8/2002 | Hobbs et al. |
| 6,194,228 B1 | 2/2001 | Fujiki et al. | | 6,434,041 B2 | 8/2002 | Forbes et al. |
| 6,198,168 B1 | 3/2001 | Geusic et al. | | 6,436,203 B1 | 8/2002 | Kaizuka et al. |
| 6,201,734 B1 | 3/2001 | Sansbury et al. | | 6,438,031 B1 | 8/2002 | Fastow |
| 6,203,613 B1 | 3/2001 | Gates et al. | | 6,444,039 B1 | 9/2002 | Nguyen |
| 6,203,726 B1 | 3/2001 | Danielson et al. | | 6,444,042 B1 | 9/2002 | Yang et al. |
| 6,206,972 B1 | 3/2001 | Dunham | | 6,444,545 B1 | 9/2002 | Sadd et al. |
| 6,207,589 B1 | 3/2001 | Ma et al. | | 6,444,895 B1 | 9/2002 | Nikawa |
| 6,208,164 B1 | 3/2001 | Noble et al. | | 6,445,023 B1 | 9/2002 | Vaartstra et al. |
| 6,210,999 B1 | 4/2001 | Gardner et al. | | 6,445,030 B1 | 9/2002 | Wu et al. |
| 6,211,035 B1 | 4/2001 | Moise et al. | | 6,448,192 B1 | 9/2002 | Kaushik |
| 6,212,103 B1 | 4/2001 | Ahrens et al. | | 6,449,188 B1 | 9/2002 | Fastow |
| 6,215,148 B1 | 4/2001 | Eitan | | 6,451,641 B1 | 9/2002 | Halliyal et al. |
| 6,217,645 B1 | 4/2001 | Vaartstra | | 6,451,662 B1 | 9/2002 | Chudzik et al. |
| 6,218,293 B1 | 4/2001 | Kraus et al. | | 6,451,695 B2 | 9/2002 | Sneh |
| 6,222,768 B1 | 4/2001 | Hollmer et al. | | 6,454,912 B1 | 9/2002 | Ahn et al. |
| 6,225,168 B1 | 5/2001 | Gardner et al. | | 6,455,717 B1 | 9/2002 | Vaartstra |
| 6,225,237 B1 | 5/2001 | Vaartstra | | 6,456,531 B1 | 9/2002 | Wang et al. |
| 6,229,175 B1 | 5/2001 | Uchida | | 6,456,536 B1 | 9/2002 | Sobek et al. |
| 6,232,643 B1 | 5/2001 | Forbes et al. | | 6,458,701 B1 | 10/2002 | Chae et al. |
| 6,232,847 B1 | 5/2001 | Marcy et al. | | 6,459,618 B1 | 10/2002 | Wang |

| | | | | | | |
|---|---|---|---|---|---|---|
| 6,461,436 B1 | 10/2002 | Campbell et al. | | 6,611,452 B1 | 8/2003 | Han |
| 6,461,914 B1 | 10/2002 | Roberts et al. | | 6,613,656 B2 | 9/2003 | Li |
| 6,461,931 B1 | 10/2002 | Eldridge | | 6,613,702 B2 | 9/2003 | Sandhu et al. |
| 6,461,970 B1 | 10/2002 | Yin | | 6,617,634 B2 | 9/2003 | Marsh et al. |
| 6,462,359 B1 | 10/2002 | Nemati et al. | | 6,618,290 B1 | 9/2003 | Wang et al. |
| 6,465,298 B2 | 10/2002 | Forbes et al. | | 6,620,670 B2 | 9/2003 | Song et al. |
| 6,465,306 B1 | 10/2002 | Ramsbey et al. | | 6,627,260 B2 | 9/2003 | Derderian et al. |
| 6,465,334 B1 | 10/2002 | Buynoski et al. | | 6,627,503 B2 | 9/2003 | Ma et al. |
| 6,472,321 B2 | 10/2002 | Srinivasan et al. | | 6,630,381 B1 | 10/2003 | Hazani |
| 6,475,857 B1 | 11/2002 | Kim et al. | | 6,632,279 B1 | 10/2003 | Ritala et al. |
| 6,476,434 B1 | 11/2002 | Noble et al. | | 6,638,627 B2 | 10/2003 | Potter |
| 6,482,740 B2 | 11/2002 | Soininen et al. | | 6,638,859 B2 | 10/2003 | Sneh et al. |
| 6,486,027 B1 | 11/2002 | Noble et al. | | 6,639,267 B2 | 10/2003 | Eldridge |
| 6,486,703 B2 | 11/2002 | Noble et al. | | 6,642,567 B1 | 11/2003 | Marsh |
| 6,487,121 B1 | 11/2002 | Thurgate et al. | | 6,642,573 B1 | 11/2003 | Halliyal et al. |
| 6,490,204 B2 | 12/2002 | Bloom et al. | | 6,645,882 B1 | 11/2003 | Halliyal et al. |
| 6,490,205 B1 | 12/2002 | Wang et al. | | 6,652,924 B2 | 11/2003 | Sherman |
| 6,492,233 B2 | 12/2002 | Forbes et al. | | 6,653,174 B1 | 11/2003 | Cho et al. |
| 6,495,436 B2 | 12/2002 | Ahn et al. | | 6,653,175 B1 | 11/2003 | Nemati et al. |
| 6,498,063 B1 | 12/2002 | Ping | | 6,656,371 B2 | 12/2003 | Drewes |
| 6,498,065 B1 | 12/2002 | Forbes et al. | | 6,656,835 B2 | 12/2003 | Marsh et al. |
| 6,498,362 B1 | 12/2002 | Forbes et al. | | 6,660,616 B2 | 12/2003 | Babcock et al. |
| 6,504,755 B1 | 1/2003 | Katayama et al. | | 6,660,660 B2 | 12/2003 | Haukka et al. |
| 6,506,666 B2 | 1/2003 | Marsh | | 6,661,058 B2 | 12/2003 | Ahn et al. |
| 6,509,280 B2 | 1/2003 | Choi | | 6,664,154 B1 | 12/2003 | Bell et al. |
| 6,514,348 B2 | 2/2003 | Miyamoto | | 6,670,284 B2 | 12/2003 | Yin |
| 6,514,828 B2 | 2/2003 | Ahn et al. | | 6,673,701 B1 | 1/2004 | Marsh et al. |
| 6,515,510 B2 | 2/2003 | Noble et al. | | 6,674,138 B1 | 1/2004 | Halliyal et al. |
| 6,518,610 B2 | 2/2003 | Yang et al. | | 6,677,250 B2 | 1/2004 | Campbell et al. |
| 6,518,615 B1 | 2/2003 | Geusic et al. | | 6,682,602 B2 | 1/2004 | Vaartstra |
| 6,518,634 B1 | 2/2003 | Nguyen et al. | | 6,683,005 B2 | 1/2004 | Sandhu et al. |
| 6,521,911 B2 | 2/2003 | Parsons et al. | | 6,683,011 B2 | 1/2004 | Smith et al. |
| 6,521,934 B2 * | 2/2003 | Yasuda .................. 257/296 | | 6,686,212 B1 | 2/2004 | Conley, Jr. et al. |
| 6,521,950 B1 | 2/2003 | Shimabukuro et al. | | 6,689,660 B1 | 2/2004 | Noble et al. |
| 6,521,958 B1 | 2/2003 | Forbes et al. | | 6,696,332 B2 | 2/2004 | Visokay et al. |
| 6,524,867 B2 | 2/2003 | Yang et al. | | 6,699,745 B1 | 3/2004 | Banerjee et al. |
| 6,524,901 B1 | 2/2003 | Trivedi | | 6,699,747 B2 | 3/2004 | Ruff et al. |
| 6,525,969 B1 | 2/2003 | Kurihara et al. | | 6,709,978 B2 | 3/2004 | Geusic et al. |
| 6,526,191 B1 | 2/2003 | Geusic et al. | | 6,709,989 B2 | 3/2004 | Ramdani et al. |
| 6,527,866 B1 | 3/2003 | Matijasevic et al. | | 6,713,846 B1 | 3/2004 | Senzaki |
| 6,531,354 B2 | 3/2003 | Maria et al. | | 6,714,455 B2 | 3/2004 | Banks |
| 6,533,867 B2 | 3/2003 | Doppelhammer | | 6,717,340 B2 | 4/2004 | Nishimura |
| 6,534,357 B1 | 3/2003 | Basceri | | 6,723,577 B1 | 4/2004 | Geusic et al. |
| 6,534,420 B2 | 3/2003 | Ahn et al. | | 6,723,606 B2 | 4/2004 | Flagan et al. |
| 6,537,613 B1 | 3/2003 | Senzaki et al. | | 6,730,575 B2 | 5/2004 | Eldridge |
| 6,538,330 B1 | 3/2003 | Forbes | | 6,740,605 B1 | 5/2004 | Shiraiwa et al. |
| 6,541,079 B1 | 4/2003 | Bojarczuk, Jr. et al. | | 6,740,928 B2 | 5/2004 | Yoshii et al. |
| 6,541,280 B2 | 4/2003 | Kaushik et al. | | 6,750,066 B1 | 6/2004 | Cheung et al. |
| 6,541,353 B1 | 4/2003 | Sandhu et al. | | 6,754,108 B2 | 6/2004 | Forbes |
| 6,541,816 B2 | 4/2003 | Ramsbey et al. | | 6,756,298 B2 | 6/2004 | Ahn et al. |
| 6,544,875 B1 | 4/2003 | Wilk | | 6,762,114 B1 | 7/2004 | Chambers |
| 6,545,297 B1 | 4/2003 | Noble et al. | | 6,767,795 B2 | 7/2004 | Ahn et al. |
| 6,545,314 B2 | 4/2003 | Forbes et al. | | 6,767,901 B1 | 7/2004 | Nagano et al. |
| 6,551,893 B1 | 4/2003 | Zheng et al. | | 6,770,536 B2 | 8/2004 | Wilk et al. |
| 6,551,929 B1 | 4/2003 | Kori et al. | | 6,777,353 B2 | 8/2004 | Putkonen |
| 6,552,387 B1 | 4/2003 | Eitan | | 6,777,715 B1 | 8/2004 | Geusic et al. |
| 6,559,014 B1 | 5/2003 | Jeon | | 6,778,441 B2 | 8/2004 | Forbes et al. |
| 6,559,472 B2 | 5/2003 | Sandhu et al. | | 6,780,704 B1 | 8/2004 | Raaijmakers et al. |
| 6,566,699 B2 | 5/2003 | Eitan | | 6,787,370 B2 | 9/2004 | Forbes |
| 6,567,303 B1 | 5/2003 | Hamilton et al. | | 6,787,413 B2 | 9/2004 | Ahn |
| 6,567,312 B1 | 5/2003 | Torii et al. | | 6,790,791 B2 | 9/2004 | Ahn et al. |
| 6,570,787 B1 | 5/2003 | Wang et al. | | 6,794,315 B1 | 9/2004 | Klemperer et al. |
| 6,573,199 B2 | 6/2003 | Sandhu et al. | | 6,800,567 B2 | 10/2004 | Cho |
| 6,580,118 B2 | 6/2003 | Ludwig et al. | | 6,803,311 B2 | 10/2004 | Choi |
| 6,580,124 B1 | 6/2003 | Cleeves et al. | | 6,804,136 B2 | 10/2004 | Forbes |
| 6,586,349 B1 | 7/2003 | Jeon et al. | | 6,808,978 B2 | 10/2004 | Kim |
| 6,586,785 B2 | 7/2003 | Flagan et al. | | 6,812,100 B2 | 11/2004 | Ahn et al. |
| 6,586,792 B2 | 7/2003 | Ahn et al. | | 6,812,513 B2 | 11/2004 | Geusic et al. |
| 6,586,797 B2 | 7/2003 | Forbes et al. | | 6,812,516 B2 | 11/2004 | Noble, Jr. et al. |
| 6,592,661 B1 | 7/2003 | Thakur et al. | | 6,818,937 B2 | 11/2004 | Noble et al. |
| 6,592,942 B1 | 7/2003 | Van Wijck | | 6,821,862 B2 | 11/2004 | Cho |
| 6,593,610 B2 | 7/2003 | Gonzalez | | 6,821,873 B2 | 11/2004 | Visokay et al. |
| 6,596,583 B2 | 7/2003 | Agarwal et al. | | 6,828,632 B2 | 12/2004 | Bhattacharyya |
| 6,596,617 B1 | 7/2003 | King et al. | | 6,831,315 B2 | 12/2004 | Raaijmakers et al. |
| 6,596,636 B2 | 7/2003 | Sandhu et al. | | 6,844,203 B2 | 1/2005 | Ahn et al. |
| 6,597,037 B1 | 7/2003 | Forbes et al. | | 6,844,260 B2 | 1/2005 | Sarigiannis et al. |
| 6,600,188 B1 | 7/2003 | Jiang et al. | | 6,852,167 B2 | 2/2005 | Ahn |
| 6,602,338 B2 | 8/2003 | Chen et al. | | 6,858,120 B2 | 2/2005 | Ahn et al. |
| 6,608,378 B2 | 8/2003 | Forbes et al. | | 6,858,444 B2 | 2/2005 | Ahn et al. |

| Patent/Publication | Date | Name |
|---|---|---|
| 6,867,097 B1 | 3/2005 | Ramsbey et al. |
| 6,873,539 B1 | 3/2005 | Fazan et al. |
| 6,884,739 B2 | 4/2005 | Ahn et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,903,969 B2 | 6/2005 | Bhattacharyya |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,950,340 B2 | 9/2005 | Bhattacharyya |
| 6,970,370 B2 | 11/2005 | Forbes |
| 6,996,009 B2 | 2/2006 | Forbes |
| 7,045,430 B2 | 5/2006 | Ahn et al. |
| 7,072,223 B2 | 7/2006 | Bhattacharyya |
| 7,112,494 B2 | 9/2006 | Forbes |
| 7,113,429 B2 | 9/2006 | Forbes |
| 7,130,216 B2 | 10/2006 | Bhattacharyya |
| 7,130,220 B2 | 10/2006 | Forbes |
| 7,133,315 B2 | 11/2006 | Forbes |
| 7,154,140 B2 | 12/2006 | Forbes |
| 7,166,509 B2 | 1/2007 | Forbes |
| 7,193,893 B2 | 3/2007 | Forbes |
| 7,221,017 B2 | 5/2007 | Forbes et al. |
| 7,221,586 B2 | 5/2007 | Forbes et al. |
| 7,257,022 B2 | 8/2007 | Forbes |
| 7,348,237 B2 | 3/2008 | Forbes |
| 7,369,435 B2 | 5/2008 | Forbes |
| 7,433,237 B2 * | 10/2008 | Forbes et al. ............ 365/185.18 |
| 7,476,586 B2 | 1/2009 | Forbes |
| 7,485,513 B2 | 2/2009 | Bhattacharyya |
| 7,489,545 B2 | 2/2009 | Forbes et al. |
| 7,494,873 B2 | 2/2009 | Forbes et al. |
| 7,583,534 B2 | 9/2009 | Forbes et al. |
| 7,622,355 B2 | 11/2009 | Forbes |
| 7,687,848 B2 | 3/2010 | Forbes et al. |
| 7,728,626 B2 * | 6/2010 | Forbes et al. .................. 326/41 |
| 7,847,344 B2 | 12/2010 | Forbes et al. |
| 2001/0002280 A1 | 5/2001 | Sneh |
| 2001/0002582 A1 | 6/2001 | Dunham |
| 2001/0009695 A1 | 7/2001 | Saanila et al. |
| 2001/0013621 A1 | 8/2001 | Nakazato |
| 2001/0030352 A1 | 10/2001 | Ruf et al. |
| 2001/0042505 A1 | 11/2001 | Vaartstra |
| 2001/0051442 A1 | 12/2001 | Katsir et al. |
| 2001/0053082 A1 | 12/2001 | Chipalkatti et al. |
| 2002/0001971 A1 | 1/2002 | Cho |
| 2002/0003252 A1 | 1/2002 | Iyer |
| 2002/0022156 A1 | 2/2002 | Bright |
| 2002/0024080 A1 | 2/2002 | Derderian et al. |
| 2002/0025628 A1 | 2/2002 | Derderian et al. |
| 2002/0027264 A1 | 3/2002 | Forbes et al. |
| 2002/0028541 A1 | 3/2002 | Lee et al. |
| 2002/0036939 A1 | 3/2002 | Tsai et al. |
| 2002/0046705 A1 | 4/2002 | Sandhu et al. |
| 2002/0048190 A1 | 4/2002 | King |
| 2002/0068466 A1 | 6/2002 | Lee et al. |
| 2002/0074565 A1 | 6/2002 | Flagan et al. |
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0089063 A1 | 7/2002 | Ahn et al. |
| 2002/0090806 A1 | 7/2002 | Ahn et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0105023 A1 | 8/2002 | Kuo et al. |
| 2002/0106536 A1 | 8/2002 | Lee et al. |
| 2002/0109158 A1 | 8/2002 | Forbes et al. |
| 2002/0110991 A1 | 8/2002 | Li |
| 2002/0111001 A1 | 8/2002 | Ahn et al. |
| 2002/0115252 A1 | 8/2002 | Haukka et al. |
| 2002/0119297 A1 | 8/2002 | Forrest et al. |
| 2002/0122885 A1 | 9/2002 | Ahn |
| 2002/0130338 A1 | 9/2002 | Ahn et al. |
| 2002/0137250 A1 | 9/2002 | Nguyen et al. |
| 2002/0137362 A1 * | 9/2002 | Jammy et al. ................. 438/791 |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0164420 A1 | 11/2002 | Derderian et al. |
| 2002/0167089 A1 | 11/2002 | Ahn et al. |
| 2002/0192974 A1 | 12/2002 | Ahn et al. |
| 2002/0192975 A1 | 12/2002 | Ahn et al. |
| 2002/0192979 A1 | 12/2002 | Ahn et al. |
| 2002/0195056 A1 | 12/2002 | Sandhu et al. |
| 2003/0001212 A1 | 1/2003 | Hu et al. |
| 2003/0001241 A1 | 1/2003 | Chakrabarti et al. |
| 2003/0003702 A1 | 1/2003 | Ahn et al. |
| 2003/0003722 A1 | 1/2003 | Vaartstra |
| 2003/0003730 A1 | 1/2003 | Li |
| 2003/0008243 A1 | 1/2003 | Ahn et al. |
| 2003/0017717 A1 | 1/2003 | Ahn |
| 2003/0020169 A1 | 1/2003 | Ahn et al. |
| 2003/0020180 A1 | 1/2003 | Ahn et al. |
| 2003/0032270 A1 | 2/2003 | Snyder et al. |
| 2003/0042526 A1 | 3/2003 | Weimer |
| 2003/0042527 A1 | 3/2003 | Forbes et al. |
| 2003/0042532 A1 | 3/2003 | Forbes |
| 2003/0042534 A1 | 3/2003 | Bhattacharyya |
| 2003/0043622 A1 | 3/2003 | Forbes |
| 2003/0043630 A1 | 3/2003 | Forbes et al. |
| 2003/0043632 A1 | 3/2003 | Forbes |
| 2003/0043633 A1 | 3/2003 | Forbes et al. |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0049942 A1 | 3/2003 | Haukka et al. |
| 2003/0052356 A1 | 3/2003 | Yang et al. |
| 2003/0052358 A1 | 3/2003 | Weimer |
| 2003/0059535 A1 | 3/2003 | Luo et al. |
| 2003/0072126 A1 | 4/2003 | Bhattacharyya |
| 2003/0089314 A1 | 5/2003 | Matsuki et al. |
| 2003/0089942 A1 | 5/2003 | Bhattacharyya |
| 2003/0102501 A1 | 6/2003 | Yang et al. |
| 2003/0104666 A1 | 6/2003 | Bojarczuk, Jr. et al. |
| 2003/0119246 A1 | 6/2003 | Ahn |
| 2003/0119313 A1 | 6/2003 | Yang et al. |
| 2003/0124794 A1 | 7/2003 | Girardie |
| 2003/0132491 A1 | 7/2003 | Ahn et al. |
| 2003/0151948 A1 | 8/2003 | Bhattacharyya et al. |
| 2003/0157764 A1 | 8/2003 | Ahn et al. |
| 2003/0159653 A1 | 8/2003 | Dando et al. |
| 2003/0160277 A1 | 8/2003 | Bhattacharyya et al. |
| 2003/0170389 A1 | 9/2003 | Sandhu |
| 2003/0170450 A1 | 9/2003 | Stewart et al. |
| 2003/0175411 A1 | 9/2003 | Kodas et al. |
| 2003/0181039 A1 | 9/2003 | Sandhu et al. |
| 2003/0183156 A1 | 10/2003 | Dando et al. |
| 2003/0185980 A1 | 10/2003 | Endo |
| 2003/0193061 A1 | 10/2003 | Osten |
| 2003/0194861 A1 | 10/2003 | Mardian et al. |
| 2003/0194862 A1 | 10/2003 | Mardian |
| 2003/0203626 A1 | 10/2003 | Derderian et al. |
| 2003/0207032 A1 | 11/2003 | Ahn et al. |
| 2003/0207540 A1 | 11/2003 | Ahn et al. |
| 2003/0207564 A1 | 11/2003 | Ahn et al. |
| 2003/0207593 A1 | 11/2003 | Derderian et al. |
| 2003/0209324 A1 | 11/2003 | Fink |
| 2003/0222300 A1 | 12/2003 | Basceri et al. |
| 2003/0224600 A1 | 12/2003 | Cao et al. |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2003/0234420 A1 | 12/2003 | Forbes |
| 2003/0235066 A1 | 12/2003 | Forbes |
| 2003/0235077 A1 | 12/2003 | Forbes |
| 2003/0235079 A1 | 12/2003 | Forbes |
| 2003/0235081 A1 | 12/2003 | Forbes |
| 2003/0235085 A1 | 12/2003 | Forbes |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0007171 A1 | 1/2004 | Ritala et al. |

| | | |
|---|---|---|
| 2004/0007734 A1 | 1/2004 | Kato et al. |
| 2004/0009679 A1 | 1/2004 | Yeo et al. |
| 2004/0014304 A1 | 1/2004 | Bhattacharyya |
| 2004/0023461 A1 | 2/2004 | Ahn et al. |
| 2004/0028811 A1 | 2/2004 | Cho et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0038525 A1 | 2/2004 | Meng et al. |
| 2004/0038554 A1 | 2/2004 | Ahn |
| 2004/0041206 A1 | 3/2004 | Bhattacharyya |
| 2004/0043541 A1 | 3/2004 | Ahn et al. |
| 2004/0043557 A1 | 3/2004 | Haukka et al. |
| 2004/0043569 A1 | 3/2004 | Ahn et al. |
| 2004/0043635 A1 | 3/2004 | Vaartstra |
| 2004/0063276 A1 | 4/2004 | Yamamoto et al. |
| 2004/0065255 A1 | 4/2004 | Yang et al. |
| 2004/0087124 A1 | 5/2004 | Kubota et al. |
| 2004/0099889 A1 | 5/2004 | Frank et al. |
| 2004/0110348 A1 | 6/2004 | Ahn et al. |
| 2004/0110391 A1 | 6/2004 | Ahn et al. |
| 2004/0135186 A1 | 7/2004 | Yamamoto |
| 2004/0144980 A1 | 7/2004 | Ahn et al. |
| 2004/0156578 A1 | 8/2004 | Geusic et al. |
| 2004/0159863 A1 | 8/2004 | Eldridge et al. |
| 2004/0164357 A1 | 8/2004 | Ahn et al. |
| 2004/0164365 A1 | 8/2004 | Ahn et al. |
| 2004/0168145 A1 | 8/2004 | Forbes |
| 2004/0168627 A1 | 9/2004 | Conley, Jr. et al. |
| 2004/0171280 A1 | 9/2004 | Conley, Jr. et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0203254 A1 | 10/2004 | Conley, Jr. et al. |
| 2004/0214399 A1 | 10/2004 | Ahn et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0235313 A1 | 11/2004 | Frank et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0009370 A1 | 1/2005 | Ahn |
| 2005/0012141 A1 | 1/2005 | Bhattacharyya |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0026374 A1 | 2/2005 | Ahn et al. |
| 2005/0026375 A1 | 2/2005 | Forbes |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0034662 A1 | 2/2005 | Ahn |
| 2005/0036370 A1 | 2/2005 | Forbes |
| 2005/0037563 A1 | 2/2005 | Ahn |
| 2005/0051828 A1 | 3/2005 | Park et al. |
| 2005/0054165 A1 | 3/2005 | Ahn et al. |
| 2005/0077519 A1 | 4/2005 | Ahn et al. |
| 2005/0082599 A1 | 4/2005 | Forbes |
| 2005/0085040 A1 | 4/2005 | Forbes |
| 2005/0087134 A1 | 4/2005 | Ahn |
| 2005/0124174 A1 | 6/2005 | Ahn et al. |
| 2005/0138262 A1 | 6/2005 | Forbes |
| 2005/0140462 A1 | 6/2005 | Akram et al. |
| 2005/0164521 A1 | 7/2005 | Ahn et al. |
| 2005/0199947 A1 | 9/2005 | Forbes |
| 2005/0249024 A1 | 11/2005 | Bhattacharyya |
| 2006/0001080 A1 | 1/2006 | Forbes |
| 2006/0002188 A1 | 1/2006 | Forbes |
| 2006/0008966 A1 | 1/2006 | Forbes et al. |
| 2006/0240626 A1 | 10/2006 | Forbes |
| 2006/0240653 A1 | 10/2006 | Bhattacharyya |
| 2006/0258097 A1 | 11/2006 | Forbes et al. |
| 2006/0261376 A1 | 11/2006 | Forbes et al. |
| 2006/0284246 A1 | 12/2006 | Forbes et al. |
| 2007/0015331 A1 | 1/2007 | Forbes |
| 2007/0091661 A1 | 4/2007 | Forbes |
| 2007/0178643 A1 | 8/2007 | Forbes et al. |
| 2008/0062757 A1 | 3/2008 | Forbes |
| 2009/0002025 A1 | 1/2009 | Forbes et al. |
| 2009/0218612 A1 | 9/2009 | Forbes et al. |
| 2010/0067304 A1 | 3/2010 | Forbes |

FOREIGN PATENT DOCUMENTS

| | | |
|---|---|---|
| EP | 1096042 A1 | 5/2001 |
| EP | 1120836 | 8/2001 |
| EP | 1124262 A2 | 8/2001 |
| EP | 1324376 A1 | 7/2003 |
| JP | 62-199019 | 9/1987 |
| JP | 61-166078 | 7/1988 |
| JP | 03-222367 | 10/1991 |
| JP | 5090169 | 4/1993 |
| JP | 06-224431 | 8/1994 |
| JP | 06-302828 | 10/1994 |
| JP | 08-255878 | 10/1996 |
| JP | 11-335849 | 12/1999 |
| JP | 2000-192241 | 7/2000 |
| JP | 2001-332546 | 11/2001 |
| WO | WO-9806139 | 2/1998 |
| WO | WO-9907000 A2 | 2/1999 |
| WO | WO-9917371 A1 | 4/1999 |
| WO | WO-0197257 A2 | 12/2001 |
| WO | WO-0231875 A2 | 4/2002 |
| WO | WO-0233729 A2 | 4/2002 |
| WO | WO-0243115 A2 | 5/2002 |
| WO | WO-2004079796 A3 | 9/2004 |

OTHER PUBLICATIONS

Aarik, J., et al., "Phase transformations in hafnium dioxide thin fiims grown by atomic layer deposition at high temperatures," Applied Surface Science, 173(1-2), (Mar. 2001), 15-21.

Aarik, Jaan, et al., "Texture development in nanocrystalline hafniumdioxide thin films grown by atomic layer deposition", Journal of Crystal Growth, 220(1-2), (Nov. 15, 2000), 105-113.

Abbas, S, A., et al., "N-Channel Igfet Design Limitations Due to Hot Electron Trapping", Technical Digest, International Electron Devices Meeting,, Washington, DC, (Dec. 1975), 35-38.

Adelmann, C, et al., "Atomic-layer epitaxy of GaN quantum wells and quantum dots on (0001) AIN", Journal of Applied Physics, 91(8), (Apr. 15, 2002), 5498-5500.

Adler, E., et al., "The Evoiution of IBM CMOS DRAM Technology", IBM Journal of Research & Development, 39(1-2), (Jan.-Mar. 1995), 167-188.

Ahn, Seong-Deok, et al., "Surface Morphology Improvement of Metalorganic Chemical Vapor Deposition Al Films by Layered Deposition of Al and Ultrathin Tin", Japanese Journal of Applied Physics, Part 1 (Regular Papers, Short Notes & Review Papers), 39(6A), (Jun. 2000), 3349-3354.

Akasaki, Isamu, et al., "Effects of AIN buffer layer on crystallographic structure and on electrical and optical properties of GaN and Ga1−xAlxN (0<x 0.4) films grown on sapphire substrate by MOVPE", Journal of Crystai Growth, 98(1-2), Nov. 1, 1989), 209-219.

Alen, Petra, et al., "Atomic Layer deposition of Ta(Al)N(C) thin fiims using trimethylaluminum as a reducing agent", Journal of the Electrochemical Society, 148(10), (Oct. 2001), G566-G571.

Alen. Petra, et al., "Atomic Layer Deposition of Ta(Al)N(C) Thin Films Using Trimethylaluminum as a Reducing Agent", Journal of the Electrochemicai Society, 148(10), (Oct. 2001), G566-G571.

Alok, D. et al., "Electrical Properties of Thermal Oxide Grown on N-type 6H-Silicon Carbide", Applied Physics Letters, 64, (May 23, 1994), 2845-2846.

Arya, S.P.S., et al., "Conduction properties of thin $Al_2O_3$ films", Thin Solid Films, 91(4), (May 28, 1982), 363-374.

Asari, K, et al., "Multi-mode and multi-level technologies for FeRAM embedded reconfigurable hardware", Solid-State Circuits Conference, 1999, Digest of Technical Papers, ISSCC, 1999 IEEE International, (Feb. 15-17, 1999), 106-107.

Bauer, F, et al., "Design aspects of MOS controlled thyristor elements", International Electron Devices Meeting 1989. Technical Digest, (1989), 297-300.

Benjamin, M., "UV Photoemission Study of Heteroepitaxial AlGaN Films Grown on 6H-SiC", Applied Surface Science, 104/105, (Sep. 1996), 455-460.

Bermudez, V., "The Growth and Properties of Al and AlN Films on GaN(0001)—(1×1)", Journal of Applied Physics, 79(1), (Jan. 1996), 110-119.

Bhattacharyya, A., "Physical & Electrical Characteristics of LPCVD Silicon Rich Nitride", ECS Technical Digest, J. Electrochem. Soc., 131(11), 691 RDP, New Orleans, (1984), 469C.

Boeringer, Daniel W., et al., "Avalanche amplification of multiple resonant tunneling through parallel silicon microcrystallites", Physical Rev. B, 51, (1995), 13337-13343.

Bright, A A, et al., "Low-rate plasma oxidation of Si in a dilute oxygen/helium plasma for low-temperature gate quality $Si/SiO_2$ interfaces", Applied Physics Letters, 58(6), (Feb. 1991), 618-621.

Britton, J. et al., "Metal-nitride-oxide IC memory retains data for meter reader", Electronics, 45(22), (Oct. 23, 1972), 119-23.

Bunshah, Rointan F, et al., "Deposition Technologies for Films and Coatings: Developments and Applications", Park Ridge, N.J., U.S.A.: Noyes Publications, (1982), 102-103.

Carter, R J, "Electrical Characterization of High-k Materials Prepared By Atomic layer CVD", IWGI, (2001), 94-99.

Chae, Junghun, et al., "Atomic Layer Deposition of Nickel by the Reduction of Preformed Nickel Oxide", Electrochemical & Soild-State Letters, 5(6), (Jun. 2002), C64-C66.

Chaitsak, Sutical, et al., "$Cu(InGa)Se_2$ thin-film solar cells with high resistivity ZnO buffer layers deposited by atomic layer deposition", Japanese Journal of Applied Physics Part 1-Regular Papers Short Notes & Review Papers, 38(9A), (Sep. 1999), 4989-4992.

Chang, C., "Novel Passivabon Dielectrics—The Boron- or Phosphorus-Doped Hydnogenated Amorphous Silicon Carbide Films", Journal of the Electrochemical Society, 132, (Feb. 1885), 418-422.

Chang, H R, et al., "MOS trench gate field-controlled thyristor", Technical Digest—International Electron Devices Meeting, (1989), 293-296.

Cheng, Baohong, et al., "The Impact of High-k Gate Dielectrics and Metal Gate Electrodes on Sub-100nm MOSFET's", IEEE Transactions on Electron Devices 46(7), (Jul. 1999), 1537-1544.

Choi, J D, et al., "A 0.15 um NAND Flash Technology With 0.11 um2 Cell Size for 1 Gbit Flash Memory", IEDM Technical Digest, (2000), 767-770.

Copel, M., et al "Structure and stability of ultrathin zirconium oxide layers on Si(001)", Applied Physics Letters, 76(4), (Jan. 2000), 438-436.

Cricchi, J R. et al., "Hardened MNOS/SOS electrically reprogrammable nonvolatile memory", IEEE Transactions on Nuclear Science, 24(6), (Dec. 1977), 2185-9.

De Blauwe, J., et al., "A novel, aerosol-nanocrystal floating-gate device for non-voiatile memory applications", IEDM Technical Digest, International Electron Devices Meeting, (Dec. 10-13, 2000), 683-686.

Dekeersniaecker, R., et al., "Electron Trapping and Detrapping Characteristics of Arsenic-Implanted $SiO_2$ Layers", J. Appl. Phys., 51, (Feb. 1980), 1085-1101.

Demichelis, F., "Influence of Doping on the Structural and Optoelectronic Properties of Amorphous and Microcrystalline Silicon Carbide", Journal of Applied Physics, 72(4), (Aug. 15, 1992), 1327-1333.

Demichelis, F., "Physical Properties of Undoped and Doped Microcrystalline SiC:H Deposited by Pecvd", Materials Research Society Symposium Proceedings, 219, Anaheim, CA, (Apr. 30-May 3, 1991), 413-418.

Desu, S B, "Minimization of Fatigue in Ferroelectric Films", Physlca Status Solidi A, 151(2), (1995), 467-480.

Dimaria, D J, "Graded or stepped energy band-gap-insulator MIS structures (GI-MIS or SI-MIS)", Journal of Applied Physics, 50(9), (Sep. 1979), 5826-5829.

Dipert, B., et al., "Flash Memory goes Mainstream", IEE Spectrum, No. 10, (Oct. 1993), 48-50.

Edelberg, E., et al., "Visible Luminescence from Nanocrystalline silicon films produced by plasma enhanced chemical vapor deposition", Appl. Phys. Lett., 68, (1996), 1415-1417.

Eierdal, L., et al., "Interaction of oxygen with Ni(110) studied by scanning tunneling microscopy", Surface Science, 312(1-2), (Jun. 1994), 31-53.

Eitan, Boaz, et al., "NROM: A Novel Localized Trapping, 2-Bit Nonvolatile Memory Cell", IEEE Electron Device Letters, 21(11), (Nov. 2000), 543-545.

Elam, J W. et al., "Kinetics of the WF6 and $Si_2H_6$ surface reactions during fungsten atomic layer deposition", Surface Science, 479(1-3), (May 2001), 121-135.

Eldridge, J. M. et al., "Analysis of ultrathin oxide growth on indium", Thin Solid Films, 12(2), (Oct. 1972), 447-451.

Eldridge, J. M., et al., "Growth of Thin PbO Layers on Lead Films. I. Experiment", Surface Science, 40(3), (Dec. 1973), 512-530.

Eldridge, J., et al., "Measurement of Tunnel Current Density in a Metal-Oxide-Metal System as a Function of Oxide Thickness", Proc. 12th Intern. Conf. on Low Temperature Physics, (1971), 427-428.

Engelhardt, M., "Modern Applications of Plasma Etching and Patterning in Silicon Process Technology", Contributions to Plasma Physics, 39(5), (1999), 473-478.

Fauchet, P M, et al., "Optoelectronics and photovoltaic applications of microcrystalline SiC", Symp. on Materials Issues in Mecrocrystalline Semiconductors, (1989), 291-292.

Fazan, P, et al., "Capacitor-Less 1-Transistor DRAM", IEEE International SOI Conference, (2002), 10-13.

Ferguson, J D. et al., "Atomic layer deposition of $Al_2O_3$ and $SiO_2$ on BN particles using sequential surface reacitions", Applied Surface Science, 162-163, (Aug. 1, 2000), 280-292.

Ferris-Prabhu, A V, "Amnesia in layered insulator FET memory devices", 1973 International Electron Devices Meeting Technical Digest, (1973), 75-77.

Ferris-Prabhu, A V, "Charge transfer in layered insulators", Solid-state Electronics, 16(9), (Sep. 1973), 1086-7.

Ferris-Prabhu, A V, "Tunnelling theories of non-volatile Semiconductor memories", Physica Status Solidi A, 35(1), (May 16, 1976), 243-50.

Fisch, D E, et al., "Analysis of thin film ferroelectric aging", Proc. IEEE Int. Reliability Physics Symp., (1990), 237-242.

Forbes, L., et al., "Field Induced Re-Emission of Electrons Trapped in $SiO_2$", IEEE Transactions on Electron Devices, ED-26 (11), Briefs, (Nov. 1979), 1816-1818.

Forsgren, Katarina, "Atomic Layer Deposition of $HiO_2$ using hafnium iodide", Conference held in Monterey, California, (May 2001), 1 page.

Frohman-Bentchkowsky, D, "An integrated metal-nitride-oxide-silicon (MNOS) memory", Proceedings of the IEEE, 57(6), (Jun. 1969), 1190-1192.

Fuyuki Takashi, et al., "Electronic Properties of the Interface between Si and $TiO_2$ Deposited at Very Low Temperatures", Japanese Journal of Applied Physics, Part 1 (Regular Papers & Short Notes), 25(9), (Sep. 1986), 1288-1291.

Fuyuki, Takashi, et al., "Initial stage of ultra-thin $SiO_2$ formation at low temperatures using activated oxygen", Applied Surface Science, 117-118, (Jun. 1997), 123-126.

Gartner, M, "Spectroellipsometric characterization of lanthanide-doped $TiO_2$ films obtained via the sol-gel technique", Thin Solid Films, 234(1-2), (1993), 561-565.

Geller, S., et al., "Crystallographic Studies of Perovskite-like Compounds. II. Rare Earth Aluminates", Acta Cryst., 9, (May 1956), 1019-1025.

Giess, E. A., et al., "Lanthanide gallate perovskite-type substrates for epitaxial, high-$T_c$ superconducting $Ba_2YCu_3O_7$- delta / films", IBM Journal of Research and Development, 34(6), (Nov. 1990), 916-926.

Goodwins, Rupert, "New Memory Technologies on the Way", http://zdnet.com.com/2100-1103-846950.html, (Feb. 2002).

Greiner, J., "Josephson Tunneling Barriers by rf Sputter Etching in an Oxygen Plasma", Journal of Applied Physics, 42(12), (Nov. 1971), 5151-5155.

Greiner, J., "Oxidation of lead films by rf sputter etching in an oxygen plasma". Journal of Applied Physics, 45(1), (Jan. 1974), 32-37.

Grimblot, J., et al., "II. Oxidation of Aluminum Films", Journal of the Electrochemical Society, 129(10), (1982), 2369-2372.

Grimblot, Jean, et al., "I. Interaction of AI films with $O_2$ at low pressures", Journal of the Electrochemical Society, 129(10), (1982), 2366-2368.

Guha, S, et al., "Atomic beam deposition of lanthanum-and yttrium-based oxide thin films for gate dielectrics", Applied Physics Letters, 77, (2000), 2710-2712.

Gundlach, K., et al., "Logarithmic conductivity of AI-$AI_2O_3$-AI tunneling junctions produced by plasma and by thermal-oxidation", Surface Science, 27(1), (Aug. 1971), 125-141.

Guo, X., "High Quality Ultra-thin (1.5 nm) High quality ultra-thin (1.5 um) $TiO_2$-$Si_3N_4$ gate dielectric for deep sub-micron CMOS technology", International Electron Devices Meeting 1999. Technical Digest, (1999), 137-140.

Hamakawa, Y., et al., "Optoelectronics and Photovoltaic Applications of Microcrystalline SiC", Materials Research Society Symposium Proceedings, 164, Boston, MA, (Nov. 29-Dec. 1, 1989), 291-1301.

Han, Kwangseok, "Characteristics of P-Channel Si Nano-Crystal Memory", IEDM Technical Digest, International Electron Devices Meeting, (Dec. 10-13, 2000), 309-312.

Hanafi, H., et al., "Fast and long retention-time nano-crystal memory", IEEE Transactions on Electron Devices, 43(9), (Sep. 1996), 1553-1558.

Hirayama, Masaki, et al., "Low-Temperature Growth of High-Integrity Silicon Oxide Films by Oxygen Radical Generated in High Density Krypton Plasma", International Electron Devices Meeting 1999, Technical Digest, (1999), 249-262.

Hodges, D. A., et al., "Analysis and Design of Digital Integrated Circuits", McGraw-Hill Book Company, 2nd Edition, (1988), 394-396.

Hodges, D. A., "Analysis and Design of Digital Integrated Circuits, 2nd Edition", McGraw-Hill Publishing. New York, (1988), 354-357.

Hori, T., et al., "A MOSFET with Si-Implanted Gate-$SiO_2$ Insulator for Nonvolatile Memory Applications", Int'l Electron Devices Meeting: Technical Digest, San Francisco, CA, (Dec, 1992), 469-472.

Hsu, C., et al., "Observation of Threshold Oxide Electric Field for Trap Generation in Oxide Films on Silicon", J. Appl. Phys., 63, (Jun. 1988), 5882-5884.

Hu, G., "Will Flash Memory Replace Hard Disk Drive?", 1994 IEEE International Electron Device Meeting, Panel Discussion, Session 24, Outline, (Dec. 1994), 2 pages.

Hubbard, K. J., et al, "Thermodynamic stability of binary oxides in contact with silicon", Journal of Materials Research, 11(11), (Nov. 1996), 2757-2776.

Hunt, C, E., et al., "Direct bonding of micromachined silicon wafers for laser diode heat exchanger applications", Journal of Micromechanics and Microengineering, 1(3), (Sep. 1991), 152-156.

Huntley, D., et al., "Deep Traps in Quartz and Their Use for Optical Dating", Canadian J. Physics, 74, (Mar./Apr. 1996), 81-91.

Hurych, Z., "Influence of Non-Uniform Thickness of Dielectric Layers on Capacitance and Tunnel Currents", Solid State Electronics, 9, 967-979.

Hwang, C G, "Semiconductor Memories for the IT Era", 2002 IEEE International Solid-State Circuits Conference. Digest of Technical Papers IEEE. Part vol. 1, San Francisco, (2002), 24-27.

Hwang, N., et al., "Tunneling and Thermal Emission of Electrons at Room Temperature and Above from a Distribution of Deep Traps in $SiO_2$", Proc. Int'l Elec. Devices and Materials Symp., Taiwan, (Nov. 1992), 559-562.

Hwang, N., et al., "Tunneling and Thermal Emission of Electrons from a Distribution of Deep Traps in SiO", IEEE Transactions on Electron Devices, 40(6), (Jun. 1993), 1100-1103.

Hybertsen, Mark S., "Absorption and Emission of Light in Nanoscale Silicon Structures", Phys. Rev. Lett., 72, (1994), 1514-1517.

Iddles, D M, et al., "Relationships between dopants, microstructure and the microwave dielectric properties of $ZrO_2$-$TiO_2$-$SnO_2$ ceramics", Journal of Materials Science, 27(23), (Dec. 1992), 6303-6310.

Inumiya, S, et al., "Conformable formation of hiqh quality ultra-thin amorphous $Ta_2O_5$ gate dielectrics utilizing water assisted deposition (WAD) for sub 50 nm damascene metal gate MOSFETs", IEDM Technical Digest, International Electron Devices Meeting, (Dec. 10-13, 2000), 649-652.

Itokawa, H, "Determnation of Bandgap and Energy Band Alignment for High-Dielectric-Constant Gate Insutators Using High-Resolution X-ray Photoelectron Spectroscopy", Extended Abstracts of the 1999 International Conference on Solid State Devices and Materials, (1999), 158-159.

Jagar, S, "Single grain thin-film-transistor (TFT) with SOI CMOS performance formed by metal-induced-lateral-crystallization", International Electron Devices Meeting 1999, Technical Digest, (1999), 1293-6.

Jeong, Chang-Wook, "Plasma-Assisted Atomic Layer Growth of High-Duality Aluminum Oxide Thin Films", Japanese Journal of Applied Physics, Part 1: Regular Papers and Short Notes and Review Papers, 40(1), (Jan. 2001), 285-289.

Jung, Tae-Sung, et al., "A 3.3 V 128 Mb multi-level NAND flash memory for mass storage applications", 1996 IEEE International Solid-State Circuits Conference, 1996, Digest of Technical Papers, 43rd ISSCO., (1996), 32-33, 412.

Juppo, Marika, "Use of 1,1-Dimethylhydrazine in the Atomic Layer Deposition of Transition Metal Nitride Thin Films", Journal of the Electrochemical Society, 147(9), (Sep. 2000), 3377-3381.

Kalnitsky, A., et al., "Memory Effect and Enhanced Conductivity in Si-Implanted Thermally Grown $SiO_2$", IEEE Trans. on Electron Devices, ED-34, (Nov. 1987), 2372.

Kalnitsky, A., et al., "Rechargeable E' Centers in Silicon-Implanted $SiO_2$ Films", J. Appl Phys., 67, (Jun. 1990), 7369-7367.

Kamata, T., et al., "Substrate Current Due to Impact Ionization in MOS-FET", Japan, J. Appl. Phys., 15, (Jun. 1976), 1127-1134.

Kato, Masataka, et al., "Read-Disturb Degradation Mechanism due to Electron Trapping in the Tunnel Oxide for Low-voltage Flash Memories", IEEE Electron Device Meeting, (1994), 45-48.

Kawai, Y, et al., "Ultra-low-temperature growth of high-integrity gate oxide films by low-energy Ion-assisted oxidation", Applied Physics Letters, 64(17), (Apr. 1994), 2223-2225.

Keomany, D, et al., "Sol gel preparation of mixed cerium-titanium oxide thin films", Solar Energy Materials and Solar Cells, 33(4), (Aug. 1994), 429-441.

Kim, C. T, et al., "Application of $Al_2O_3$ Grown by Atomic Layer Deposition to DRAM and FeRAM", International Symposium in Integrated Ferroelectrics, (Mar. 2000), 316.

Kim, D., et al., "Atomic Control of Substrate Termination and Heteroepitaxial Growth of $SrTiO_3$/$LaAIO_3$ Films", Journal of the Korean Physical Society, 36(6), (Jun. 2000), 444-448.

Kim, H., "Leakage current and electrical breakdown in metal-organic chemical vapor deposited $TiO_2$ dielectrics on silicon substrates", Applied Physics Letters, 69(25), (Dec. 16, 1996), 3860-3862.

Kim, Y, et al., "Substrate dependence on the optical properties of $Al_2O_3$ films grown by atomic layer deposition", Applied Physics Letters, 71(25), (Dec. 22, 1997), 3604-3606.

Kim, Y., et al., "Substrate dependence on the optical properties of $Al_2O_3$ films grown by atomic layer deposition", Applied Physics Letters, 71(25), (Dec. 22, 1997), 3604-3606.

Kim, Yeong K, et al., "Novel capacitor technology for high density stand-alone and embedded DRAMs", International Election Devices Meeting 2000. Technical Digest. IEDM, (2000), 369-372.

Kim, Yong S, et al., "Effect of rapid thermal annealing on the structure and the electrical properties of atomic-layer-deposited $Ta_2O_5$ films", Journal of the Korean Physical Society, (Dec. 2000), 975-979.

Klaus, J W, et al., "Atomic layer deposition of tungsten nitride films using sequential surface reactions", Journal of the Electrochemical Society, 147(3), (Mar. 2000), 1175-81.

Koo, J, "Study on the characteristics of TiAlN thin film deposited by atomic layer deposition method", Journal of Vacuum Science & Technology A—Vacuum Surfaces & Films, 19(6), (Nov. 2001), 2831-4.

Krauter, G., et al, "Room Temperature Silicon Wafer Bonding with Ultra-Thin Polymer Films", Advanced Materals, 9(5), (1997), 417-420.

Kubaschewski, O., et al., "Oxidation of Metals and Alloys", Butterworths, London, (1962), 53-63.

Kubaschewski, O., et al., "Oxidation of Metals and Alloys,", Butterworths, London, Second Edition (1962), 1-3, 5,6, 8-12, 24, 36-39.

Kukli, K., et al., "Controlled growth of yttrium oxysulphide thin films by atomic layer deposition", Materials Science Forum, 315-317, (1999), 216-221.

Kukli, Kaupo, "Atomic Layer Deposition of Titanium Oxide $TiI_4$ and $H_2O_2$ ", Chemical Vapor Deposition, 6(6), (2000), 303-310.

Kukli, Kaupo, et al., "Atomic layer deposition of zirconium oxide from zirconium tetraiodide, water and hydrogen peroxide", Journal of Crystal Growth, 231(1-2), (Sep. 2001), 262-272.

Kukli, Kaupo, "Dielectric Properties of Zirconium Oxide Grown by Atomic Layer Deposition from Iodide Precursor", Journal of The Electrochemical Society, 148(12), (2001), F227-F232.

Kukli, Kaupo, et al., "Real-time monitoring in atomic layer deposition of $TiO_2$ from $TiI_4$ and $H_2O$-$H_2O_2$ ", Langmuir, 16(21), (Oct. 17, 2000), 8122-8128.

Kukli, Kaupo, "Tailoring the dielectric properties of $HfO_2$-$Ta_2O_3$ nanolaminates", Appl. Phys. Lett., 68, (1996), 3737-3739.

Kukli, Kukli, et al., "Development of Dielectric Properties of Niobium Oxide, Tantalum Oxide, and Aluminum Oxide Based Nanolayered Materials", Journal of the Electrochemical Society, 148(2).

Kumar, M. Jagadesh, "Lateral Schottky Rectifiers for Power Integrated Circuits", International Workshop on the Physics of Semiconductor Devices, 11th, 4746, Allied Publishers Ltd., New Delhi, India, (2002), 414-421.

Kwo, J., "Properties of high k gate dielectrics $Gd_2O_3$ and $Y_2O_3$ for Si", Journal of Applied Physics, 89(7), (2001), 3920-3927.

Lai, S K, et al., "Comparison and trends in Todays dominant E2 Technologies", IEDM Technical Digest, (1986), 560-583.

Lee, A E, et al., "Epitaxially grown sputtered $LaAlO_3$ films", Applied Physics Letters, 57(19), (Nov. 1990), 2019-2021.

Lee, Cheng-Chung, et al., "Ion-assisted deposition of silver thin flims", Thin Solid Films, 359(1), (Jan. 2000), 95-97.

Lee, Dong Heon, et al., "Metalorganic chemical vapor deposition of $TiO_2N$ anatase thin film on Si substrate", Applied Physics Letters, 66(7), (Feb. 1995), 815-816.

Lee, J., et al., "Effect of polysilicon gate on the flatband voltage shift and mobility degradation for ALD-$Al_2O_3$ gate dielectric", International Electron Devices Meeting 2000. Technical Digest, IEDM, (2000), 1645-648.

Lee, L P, et al., "Monolithic 77 K dc SQUID magnetometer", Applied Physics Letters, 59(23), (Dec. 1991), 3051-3053.

Lee, M., et al., "Thermal Self-Limiting Effects in the Long-Term AC Stress on N-Channel LDD MOSFET's", Proc,: 9th Biennial University/Government/Industry Microelectronics Symp., Melbourne, FL, (Jun. 1991), 93-97.

Lee, Y. K, et al., "Multi-level vertical channel SONOS nonvolatile memory on SOI", 2002 Symposium on VLSI Technology, 2002. Digest of Technical Papers., Digest of Technical Vapours, (Jun. 11, 2002), 208-209.

Lei, T., "Epitaxial Growth and Characterization of Zinc-Blende Gallium Nitride on (001) Silicon", Journal of Applied Physics, 71(10), May 1992), 4933-4943.

Leskela, M, "ALD precursor chemistry: Evolution and future challenges", Journal de Physique IV (Proceedings), 9(8), (Sep. 1999), 837-852.

Liu, C. T., "Circuit Requirement and Integration Challenges of Thin Gate Dielectrics for Ultra Small MOSFETs", International Electron Devices Meeting 1998. Technical Digest, (1998), 747-750

Liu, Y C, et al., "Growth of ultrathin $SiO_2$ on Si by surface irradiation with an $O_2$ +Ar electron cyclotron resonance microwave plasma at low temperatures", Journal of Applied Physics, 85(3), (Feb. 1999) 1911-1915.

Liu, Z., et al., "Low Programming Voltages and Long Retention Time in Metal Nanocrystal EEPROM Devices", Digest of the IEEE Device Research Conference, Notre Dame, Indiana, (Jun. 25-27, 2001), 79-80.

Luan, H., "High Quality $Ta_2O_3$ Gate Dielectrics with Tox,eq less than 10A", IEDM, (1999), pp. 141-144.

Lucovsky, G, et al., "Microscopic model for enhanced dielectric constants in low concentration $SiO_2$-rich noncrystalline Zr and Hf silicate alloys", Applied Physics Letters, 77(18) (Oct. 2000), 2912-2914.

Lusky, et al., "Characterization of channel hot electron injection by the subthreshold slope of NROM/sup TM/ device", IEEE Electron Device Letters, vol.22, No. 11, (Nov. 2001), 556-558.

Lusky, Eli, et al., "Characterization of Channel Hot Electron Injection by the Subthreshold Slope of NROM Device", IEEE Electron Device Letters, 22(11), (Nov. 2001), 556-558.

Lusky, Eli, et al., "Characterization of channel hot electron injection by the subthreshold slope of NROM/sup TM/ device", IEEE Electron Device Letters, 22(11), (Nov. 2001), 556-558.

MA, Yanjun, et al., "Zirconium oxide based gate dielectrics with equivalent oxide thickness of less than 1.0 nm and performance of submicron MOSFET using a nitride gate replacement process", International Electron Devices Meeting 1999. Technical Digest, (1999), 149-152.

Maayan, E, et al., "A 512Mb BROM Flash Data Storage: Memory with 8MB/s Data Rate", ISSCC 2002 / Session 6 / SRAM and Non-Volatile Memories, (Feb. 2002), 4 pages.

Maayan, Eduardo, et al., "A 512Mb NROM Flash Data Storage Memory with 8MB/s Data Rate", Solid-State Circuits Conference, 2002. Digest of Technical Papers, ISSCC, (2004) 4 pgs.

Manchanda, L, "High K Dielectrics for CMOS and Flash", Extended Abstracts of the 1999 International Conference on Solid State Devices and Materials, Tokyo, (1999), 150-151.

Manchanda, L., et al., "High-K Dielectrics for Giga-Scale CMOS and Non-Voiatile Memory Technology", Lucent Technologies, Bell Laboratories, (2000), 1 page.

Manchanda, L., "Si-doped aluminates for high temperature metal-gate CMOS: Zr-Al-Si-O, a novel gate dielectric for low power applications", IEDM Technical Digest, International Electron Devices Meeting, (Dec. 10-13, 2000), 23-26.

Marlid, Bjorn, et al., "Atomic layer deposition of BN thin films", Thin Solid Films, 402(1-2), (Jan. 2002), 167-171.

Marshalek, R., et al., "Photoresponse Characteristics of Thin-Film Nickel-Nickel Oxide-Nickel Tunneling Junctions", IEEE Journal of Quantum Electronics, QE-19(4), (1983), 743-754.

Martin, P J, et al., "Ion-beam-assisted deposition of thin films", Applied Optics, 22(1), (Jan. 1983), 178-184.

Martins, R, "Transport Properties of Doped Silicon Oxycarbide Microcrystalline Films Produced by Spatial Separation Techniques", Solar Energy Materials and Solar Cells, 41-42, (1996), 493-517.

Martins, R. "Wide Band Gap Microciystalline Silicon Thin Films", Diffusion and Defect Data : Solid State Phenomena, 44-46, Part 1, Scitec Publications, (1995), 299-346.

Masuoka, F., et al., "A 256K Flash EEPROM using Triple Polysilicon Technology", IEEE International Solid-State Circuits Conference, Digest of Technical Papers, (1985), 168-169.

Masuoka, F., et al., "A New Flash EEPROM Cell using Triple Polysilicon Technology". International Electron Devices Meeting, Technical Digest, San Francisco, CA, (1984), 464-467.

Min, J., "Metal-organic atomic-layer deposition of titanium-silicon-nitride films", Applied Physics Letters, 75(11), (1999), 1521-1523.

Min, Jae-Sik, et al., "Atomic layer deposition of TiN films by alternate supply of tetrakis (ethylmethylamino)-tilanium and ammonia", Japanese Journal of Applied Physics Part 1-Regular Papers Short Notes & Review Papers, 37(9A), (Sep. 1998), 4999-5004.

Moazzami, R. "Endurance properties of ferroelectric PZT thin films", Technical Digest., International Electron Devices Meeting, 1990. IEDM '90., San Francisco, (1990), 417-20.

Moazzami, R. "Ferroelectric PZT thin films for semiconductor memory", Ph.D Thesis, University of California Berkeley, (1991).

Molnar, R., "Growth of Gallium Nitride by Electron-Cyclotron Resonance Plasma-Assisted Molecular-Beam Epitaxy: The Role of Charged Species", Journal of Applied Physics, 76(8), (Oct. 1994), 4587-4595.

Molodyk, A A, et al., "Volatile Sutfactant-Assisted MOCVD: Application to $LaAlO_3$ Thin Film Growth", Chemical Vapor Deposition, 6(3), (Jun. 2000), 133-138.

Molsa, Heini, et al., "Growth of yttrium oxide thin films from beta-diketonate precursor", Advanced Materials for Optics and Electronics, 4(6), (Nov.-Dec. 1994) 389-400.

Mori, S., et al., "Reliable CVD Inter-Poly Dielectrics for Advanced E&EEPROM", Symposium on VSLI Technology, Digest of Technical Papers, 16-17.

Morishita, S, "Atomic-layer chemical-vapor-deposition of $SiO_2$ by cyclic exposures of $CH_3OSi(NC-O)_3$ and $H_2O_2$", Japanese Journal of Applied Physics Part 1-Regular Papers Short Notes & Review Papers, 34(10), (Oct. 1995), 5738-42.

Mormiaki, Masaru, et al., "Improved metal gate process by simultaneous gate-oxide nitridation during $W/WN_x$ gate formation", Japanese Journal of Applied Physics Part 1-Regular Papers Short Notes Review Papers, 39(4B), (Apr. 2000), 2177-2180.

Muller, D. A., et al., "The electronic structure at the atomic scale of ultrathin gate oxides", Nature, 399, (Jun. 24, 1999), 756-61.

Muller, H., "Electrical and Optical Properties of Sputtered $In_2O_3$ Films", Physica Status Solidi, 27(2), (1968), 723-731.

Muller, R. S. et al., In: Device Electronics for Integrated Circuits, Second Edition, John Wiley & Sons, New York, (1986), p. 157.

Nakagawara, Osamu, et al., "Electrical properties of $(Zr, Sn)TiO_4$ dielectric thin film prepared by pulsed laser deposition", Journal of Applied Physics, 80(1), (Jul. 1996) 388-392.

Nakajima, Anri, et al., "$NH_3$-annealed atomic-layer-deposited silicon nitride as a high-k gate dielectric with high reliability", Applied Physics Letters, 80(7), (Feb. 2002), 1252-1254.

Nakajima, Anri, "Soft breakdown free atomic-layer-deposited silicon-nitride/$SiO_2$ stack gate dielectrics", International Electron Devices Meeting. Technical Digest, (2001), 6.5.1-4.

Nemati, F, et al., "A Novel high density, low voltage SRAM cell with a vertical NDR device", 1998 Symposium on VLSI Technology Digest of Technical Papers, (1998), 66-7.

Nemati, F, et al., "A novel thyristor-based SRAM cell (T-RAM) for high-speed, low-voitage, giga-scale memories", International Electron Devices Meeting 1999. Technical Digest, (1999), 283-6.

Neumayer, D A, et al., "Materials characterizatior of $ZrO_2$-$SiO_2$ and $HfO_2$-$SiO_2$ binary oxides deposited by chemical solution deposition", Journal of Applied Physics, 90(4), (Aug. 15, 2001), 1801-1808.

Mieminen, Minna, et al., "Formation and stability of lanthanum oxide thin films deposited from B-diketonate precursor", Applied Surface Science, 174(2), (Apr. 16, 2001), 155-165.

Nilisk, A, "Atomic-scale optical monitoning of the initial growth of $TiO_2$ thin films", Proceedings of the SPIE—The International Society for Optical Engineering, 4318, (2001), 72-77.

Ohba, R., et al., "Non-volatile Si quantum memory with self-aligned doubly-stacked dots", IEDM Technical Digest. International Electron Devices Meeting, (Dec. 10-13, 2000), 313-316.

Ohkawa, M., et al., "A 98 mm2 3.3 V 64 Mb flash memory with FN-NOR type 4-level cell", 1996 IEEE International Solid-State Circuits Conference, 1996, Digest of Technical Papers, 43rd ISSCC., (1996), 36-37.

Ohring, Milton, "The Materials Science of Thin Films", Boston : Academic Press, (1992), 118,121,125.

Ohsawa, Takashi, et al., "Memory design using one-transistor gain cell on SOI", IEEE International Solid-State Circuits Conference. Digest of Technical Papers, vol. 1, (2002), 452-455.

Okhonin, S., et al., "A SOI capacitor-less 1T-DRAM concept", 2001 IEEE International SOI Conference, Proceedings, IEEE, 2001, (2000), 153-154.

Or, S. S.B., et al., "Thermal Re-Emission of Trapped Hot Electrons in NMOS Transistors", IEEE Trans. on Electron Devices, 38(12), (Dec. 1991), 2712.

Osten, H. J., et al., "High-k gate dielectrics with ultra-low leakage current based on praseodymium oxide", International Electron Devices Meeting 2000. Technical Digest, IEDM, (2000), 653-656.

Pan, Tung Ming, et al., "High quality ultrathin $CoTiO_3$ high-k gate dielectrics", Electrochemical and Solid-State Letters, 3(9), (Sep. 2000), 433-434.

Pan, Tung Ming, et al., "High-k cobalt-titanium oxide dielectrics formed by oxidation of sputtered Co/Ti or Ti/Co films", Applied Physics Letters, 78(10), (Mar. 5, 2001), 1439-1441.

Pankove, J., "Photoemission from GaN", Applied Physics Letters, 25(1), Jul. 1, 1974), 53-55.

Papadas, C., "Modeling of the Intrinsic Retention Characteristics of FLOTOX EEPROM Cells Under Elevated Temperature Conditions", IEEE Transaction on ElectronDevices, 42, (Apr. 1995), 678-682.

Paranjpe, Ajit, et al., "Atomic layer deposition of $AlO_x$ for thin film head gap applications", Journal of the Electrochemical Society, 148(9), (Sep. 2001), 465-471.

Park, Byung-Eun, et al., "Electrical properties of $LaAlO_3Si$ and $Sr_{3\ 3}Bl_{2\ 2}Ta_2O_3/LaAlO_3Si$ Stuctures", Applied Physics Letters, 79(6), (Aug. 2001), 806-808.

Park, Jin-Seong, et al., "Plasma-Enhanced Atomic Layer Deposition of Tantalum Nitrides Using Hydrogen Radicals as a Reducing Agent", Electrochemical & Solid-State Letters, 4(4), (Apr. 2001), C17-19.

Pashley, R., et al., "Flash Memories: the best of two worlds", IEEE Spectrum, 26(12), (Dec. 1989), 30-33.

Perkins, Charles M. et al., "Electrical and materials properties of $ZrO_2$ gate dielectrics grown by atomic layer chemical vapor deposition", Applied Physics Letters, 78(16), (Apr. 2001), 2357-2359.

Pollack, S., et al., "Tunneling Through Gaseous Oxidized Flims of $Al_2O_3$", Transactions of the Metallurgical Society of AIME, 233, (1965), 497-501.

Prendergast, Jim, "FLASH or DRAM: Memory Choice for the Future", IEEE Electron Device Meeting, Session 25, Phoenix, AZ, (1995).

Puurunen, R L, et al., "Growth of aluminum nitride on porous silica by atomic layer chemical vapour deposition", Applied Surface Science, 165(2-3), (Sep. 12, 2000), 193-202.

Qi, Wen-Jie, et al., "MOSCAP and MOSFET characteristics using $ZrO_2$ gate dielectric deposited directly on Si", International Electron Devices Meeting 1999. Technical Digest, (1999), 145-148.

Qi, Wen-Jie, et al., "Performance of MOSFETs with ultra thin ZrO/sub 2/ and Zr silicate gate dielectrics", 2000 Symposium on VLSI Technology. Digest of Technical Papers, (2000), 40-41.

Ramakrishnan, E S, et al., "Dielectric properties of radio frequency magnetron sputter deposited zirconium titanate-based thin films", Journal of the Electrochemical Society, 146(1), (Jan. 1998), 358-362.

Rayner Jr., G, et al., "The structure of plasma-deposited and annealed pseudo-binary $ZrO_2$-$SiO_2$ alloys", Materials Research Society Symposium—Proceedings, 611, (2000), C131-C139.

Renlund, G. M., "Silicon oxycarbide glasses: Part I, Preparation and chemistry", J. Mater. Res., (Dec. 1991), pp. 2716-2722.

Renlund, G. M., "Silicon oxycarbide glasses: Part II. Structure and properties", J. Mater. Res, vol. 6, No. 12, (Dec. 1991), pp. 2723-2734.

Ritala, Mikko, "Atomic Layer Epitaxy Growth of Titanium, Zirconium and Hafnium Dioxide Thin Films", Annales Academiae Scientiarum Fennicae, (1994), 24-25.

Ritala, Mikko, "Zirconium dioxide thin films deposited by ALE using zirconium tetrachloride as percursor", Applied Surface Science, 75, (Jan. 1994), 333-340.

Robertson, J., "Band offsets of wide-band-gap oxides and implications for future electronic devices", Journal of Vacuum Science & Technology B (Microelectronics and Nanometer Structures), 18(3), (May-Jun. 2000), 1785-1791.

Robertson, J., et al., "Schottky Barrier height of Tantalum oxide, barium strontium titanate, lead titanate, and strontium bismuth tantalate", Applied Physics Letters, 74(8), (Feb. 22, 1999), 1168-1170.

Rotondaro, A L. et al., "Advanced CMOS Transistors with a Novel HfSiON Gate Dielectric", Symposium on VLSI Technology Digest of Technical Papers, (2002), 148-149.

Saito, Yuji, et al., "Advantage of Radical Oxidation for Improving Reliability of Ultra-Thin Gate Oxide", 2000 Symposium on VLSI Technology Digest of Technical Papers, (2000), 176-177.

Saito, Yuji, et al., "High-Integrity Silicon Oxide Grown at Low-Temperature by Atomic Oxygen Generated in High-Density Krypton Plasma". Extended Abstracts of the 1999 International Conference on Solid State Devices and Materials, (1999), 152-153.

Sanders, B W, et al., "Zinc Oxysulfide Thin Films Grown by Atomic Layer Deposition", Chemistry of Materials, 4(5), (1992), 1005-1011.

Schoenfeld, O. et al., "Formation of Si quantum dots in nanocrystalline silicon", Solid-State Electronics, 40(1-8), Proc. 7th Int. Conf. on Modulated Semiconductor Structures, Madrid, (1996), 605-608.

Shanware, A, et al., "Reliability evaluation of HfSiON gate dielectric film with 12.8 A $SiO_2$ equivalent thickness", International Electron Devices Meeting. Technical Digest, (2001), 6.6.1-6.64.

She Min, et al., "Modeling and design study of nanocrystal memory devices", IEEE Device Research Conference, (2001), 139-40.

Shi, Ying, et al., "Tunneling Leakage Current in Ultrathin (<4 nm) Nitride/Oxide Stack Dielectrics", IEEE Electron Device Letters, 19(10), (Oct. 1998), 388-390.

Shimabukuro, R. L., et al., "Circuitry for Artificial Neural Networks with Non-volatile Analog Memories", IEEE Int'l Symp. on Circuits and Systems, 2, (1989), 1217-1220.

Shimabukuro, R. L., et al., "Dual-Polarity Nonvolatile MOS Analogue Memory (MAM), Cell for Neural-Type Circuity", Electronics Lett., 24, (Sep. 15, 1988), 1231-1232.

Shimada, Hiroyuki, et al., "Tantalum nitride metal gate FD-SOI CMOS FETs using low resistivity self-grown bcc-tantalum layer", IEEE Transactions on Electron Devices, vol. 48, No. 8, (Aug. 200), 1619-1626.

Shin, Chang Ho, "Fabrication and Characterization of MFISFET using $Al_2O_3$ Insulating Layer for Non-volatile Memory", 12th International Symposium in Integrated Ferroelectrics, (Mar. 2000), 9 pages.

Shin, Chang Ho, et al., "Fabrication and Characterization of MFISFET using $Al_2O_3$ Insulating Layer for Non-Volatile Memory", 12th International Symposium in Integrated Ferroelectrics, (Mar. 2000), 1-9.

Shinohe, T, et al., "Ultra-high di/dt 2500 V MOS assisted gate-triggered thyristors (MAGTs) for high repetition excimer laser system", International Electron Devices Meeting 1989. Technical Digest, (1989), 301-4.

Shirota, R, et al., "A 2.3 mu rn/sup 2/ memory cell structure for 16 Mb NAND EEPROMs", International Electron Devices Meeting 1990. Technical Digest, San Francisco, (1990), 103-106.

Simmons, J., "Generalized Formula for the Electric Tunnel Effect between Similar Electrodes Separated by a Thin Insulating Film", Journal of Applied Physics, 34(6), (1963), 1793-1803.

Smith, Ryan C, "Chemical vapour deposition of the oxides of titanium, zirconium and hafnium for use as high-k materiais in microelectronic devices. A carbon-free precursor for the synthesis of hafnium dioxide", Advanced Materials for Optics and Electronics, 10(3-5), (May-Oct. 2000), 105-106.

Sneh, Ofer, "Thin film atomic layer deposition equipment for semiconductor processing", Thin Solid Films, , 402, (2002), 248-261.

Solanki, Raj, et al., "Atomic Layer Deposition of Copper Seed Layers", Electrochemical & Soild-State Letters, 3(10), (Oct. 2000), 479-480.

Song, Hyun-Jung, et al., "Atomic Layer Deposition of $Ta_2O_5$ Films Using $Ta(OC_2H_5)_5$ and $NH_3$", Ultrathin $SiO_2$ and High-k Materials for ULSI Gate Dielectrics. Symposium, (1999), 469-471.

Suh, Kang-Deog, et al., "A 3.3 V 32 Mb NAND flash memory with incremental step pulse programming scheme", IEEE J. Solid-State Circuits, 30, (Nov. 1995), 1149-1156.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992) 84-89.

Swalin, R., "Equilibrium between Phases of Variable Composition", In; Thermodynamics of solids, New York, J. Wiley, 2nd Edition, (1972), 165-180.

Sze, S M, "Physics of Semiconductor Devices", New York : Wiley, (1981), 504-506.

Sze, S M, "Physics of Semiconductor Devices", New York : Wiley, (1981), 431.

Sze, S M, "Physics of Semiconductor Devices", New York ; Wiley, (1981), 473.

Sze, S M, "Physics of semiconductor devices", New York: Wiley, (1981), 504-506.

Sze S., "Physics of Semiconductor Devices, Second Edition", John Wiley & Sons, New York, (1981), 553-556.

Sze. S. M. "Table 3: Measured Schottky Barrier Heights", In: Physics of Semiconductor Devices, John Wiley & Sons, Inc., (1981), p. 291.

Takemoto, J. H., et al., "Microstrip Resonators and Filters Using High-TC Superconducting Thin Films on LaAlO3", IEEE Transaction on Magnetics, 27(2), (Mar. 1991), 2549-2552.

Takeuchi, K., et al., "A Double-Level-V Select Gate Array Architecture for Multilevel NANAD Flash Memories", IEEE Journal of Solid-State Circuits, 31, (Apr. 1996), 602-609.

Tarre, A, et al., "Comparative study of low-temperature chloride atomic-layer chemical vapor deposition of TiO2 and SnO2", Applied Surface Science, 175-176, (May 2001), 111-116.

Thomas, J., et al., "Electron Trapping Levels in Silicon Dioxide Thermally Grown in Silicon", J. Physics and Chemistry of Solids, 33, (1972), 2197-2216.

Thompson, S., et al., "Positive Charge Generation in SiO(2) by Electron-Impact Emission of Trapped Electrons", J. Appl. Phys. 72, (Nov. 1992), 4683-4695.

Thompson, S., et al., "Tunneling and Thermal Emission of Electrons from a Distribution of Shallow Traps in $SiO_2$", Appl. Phys. Lett., 58, (Mar. 1991), 1262-1264.

Tiwari, S., et al., "A silicon nanocrystals based memory", Appl. Physics Lett., 68, (1996), 1377-1379.

Tiwari, Sandip, et al., "Volatile and non-volatile memories in silicon with nano-crystal storage", International IEEE Electron Devices Meeting, (Dec. 1995), 521-524.

Tsu, R., et al., "Tunneling in nanoscale silicon particles embedded in an $a-SiO_2$, matrix", 54th Annual Device Research Conference, Digest, IEEE, Abstract, (1996), 178-179.

Tsu, Raphael, et al., "Slow Conductance oscilliations in nanoscale silicon clusters of quantum dots", Appl. Phys. Lett., 65, (1994), 842-844.

Van Dover, R B, "Amorphous Ianthanide-doped $TiO_x$ dielectric films", Applied Physics Letters, 74(20), (May 1999), 3041-3043.

Van Dover, R. B., "Discovery of a useful thin-film dielectric using a composition-spread approaoh", Nature, 392, (Mar. 12, 1998), 162-164.

Van Dover, Robert B. et al., "Deposition of Uniform Zr-Sn-Ti-O films by ON-Axis Reactive Sputtering", IEEE Electron Device Letters, 19(9), (Sep. 1998), 329-331.

Van Meer, H, "Ultra-thin film fuliy-depleted SOI CMOS with raised G/S/D device architecture for sub-100 nm applications", 2001 IEEE International SOI Conference, (2001), 45-6.

Viirola, H, et al., "Controlled growth of antimony-doped tin dioxide thin films by atomic layer epitaxy", Thin Solid Films, 251, (Nov. 1994), 127-135.

Viirola, H, et al., "Controlled growth of tin dioxide thin films by atomic layer epitaxy". Thin Soild Films, 249(2), (Sep. 1994), 144-149.

Visokay, M R, "Application of HfSiON as a gate dielectric materiel", Applied Physics Letters, 80(17), (Apr. 2002), 3183-3185.

Vuillaume, D., et al., "Charging: and Discharging Properties of Electron Traps Created by Hot-Carrier Injections in Gate Oxide of N-Channel Metal Oxide semiconductor Fieid Effect Transistor", J. Appl. Phys., 73, (Mar. 1983), 2559-2563.

Wel, L S, et al., "Trapping, emission and generation in MNOS memory devices", Soild-State Electronics, 17(6), (Jun. 1974), 591-8.

White, M H, et al., "Characterization of thin-oxide MNOS memory transistors", IEEE Transactions on Electron Devices, ED-19(12), (Dec. 1972), 1280-1288.

White, M H, "Direct tunneling in metat-nitride-oxide-silicon (MNOS) structure", Programme of the 31st physical electronics conference, (1971), 1.

Wilk, G D, et al, "Hafnium and zirconium silicates for advanced gate dielectrics", Journal of Applied Physics, 87(1), (Jan. 2000), 484-492.

Wilk, G. D., "High-K gate dielectrics: Current status and materials properties considerations", Journal of Applied Physics, 89(10), (2001), 5243-5275.

Wolf, S, "Ion implantation for VLSI", Silicon Processing for the VLSI Era, vol. 1, (1990), 280.

Wolf, S., "MOS devices and NMOS process integration", In: Silicon Processing for the VLSI Era, vol. 2, Lattice Press, Sunset Beach, CA, (1990), 3-19.

Wolf, S., "Thermal oxidation of single crystat oxidation", In: Silicon Processing for the VLSI Era, vol. 1, Lattice Press, Sunset Beach, CA, (1990), 227.

Wolf, Stanley, et al., "Silicon Processing for the VLSI Era—vol. I; Process Technelogy", Second Edition, Lattice Press, Sunset Beach, California, (2000), 443.

Wood, S W, "Ferroelectric memory design", M.A.Sc. thesis, University of Toronto, (1992).

Yagishita, Atsushi, et al.,; "Dynamic threshold voltage damascene metal gate MOSFET (DT-DMG-MOS) with low threshold voltage, high drive current and uniform electrical characteristics", International Electron Devices Meeting 2000, Technical Digest, IEDM, (Dec. 2000), 663-666.

Yamaguchi, Takeshi, et al., "Band Diagram and Carrier Conduction Mechanism in $ZrO_2$/Zr-silicates/Si MIS Structure Fabricated by Pulsed-laser-ablation Deposition", Electron Devices Meeting, 2000. IEDM Technical Digest, International, (2000), 19-22.

Yan. J., "Structural and electrical characterization of $TiO_2$ grown from titanium tetrakis-isopropoxide (TTIP) and TTIP/$H_2$ O ambients", Journal of Vacuum Science & Technology B (Microelectronics and Nanometer Structures), 14(3), (May-Jun. 1998), 1706-1711.

Ye, Qiu-Yi, et al., "Resonant tunneling via microcrstalline-silicon quantum confinement", Phys Rev B Condens Matter,, 44(4), (Jul. 15, 1991), 1809-1811.

Yih, C. M., et al., "A Consistent Gate and Substrate Current Model for Sub-Micron MOSFET'S by Considering Energy Transport", Int'l Symp. on VLSI Tech., Systems and Applic., Taiwan, (1995), 127-130.

Yoder, M, "Wide bandgap semiconductor materia's and devices", IEEE Transactions on Election Devices, 43(10), (Oct. 1996), 1633-1636.

Young, D., et al., "Characterization of Electron Traps in Aluminum-lmplanted $SiO_2$", IBM J. Research and Development, 22, (May 1978), 285-288.

Zhang, H., "Atomic Layer Deposition of High Dielectric Constant Nanolaminates", Journal of The Electrochemical Society, 148(4), (Apr. 2001), F63-F66.

Zhao, X,. et al., "Nanocrystailine Si: a material constructed by Si quantum dots", Materials Science and Engineering B, 35(1-2), Proceedings of The First International Conference on Low Dimensional Structures and Devices , Singapore, Dec. 1995), 467-471.

Zhu, W J, et al., "Current transport in metal/hafnium oxide/silicon structure", IEEE Electron Device Letters, 23, (2002), 97-99.

Zhu, W. et al., "$HfO_2$ and HfAlO for CMOS: Thermal Stability and Current Transport", IEEE International Electron Device Meeting 2001, 463-466.

Zucker, O, et al., "Appiication of Oxygen Plasma Processing to Silicon Direct Bonding", Sensors and Actuators A, 36. (1993), 227-231.

* cited by examiner

MEMORY UTILIZING OXIDE NANOLAMINATES

CROSS REFERENCE TO RELATED APPLICATIONS

This application is a Continuation of U.S. application Ser. No. 12/205,338, filed Sep. 5, 2008 now U.S. Pat. No. 7,728,626, which is a Divisional of U.S. application Ser. No. 11/458,854, filed Jul. 20, 2006 now U.S. Pat. No. 7,433,237, which is a Continuation of U.S. application Ser. No. 10/190,717, filed Jul. 8, 2002, now U.S. Pat. No. 7,221,586, which applications are incorporated herein by reference in their entirety.

This application is related to the following co-pending, commonly assigned U.S. patent applications: "Memory Utilizing Oxide-Nitride Nanolaminates," Ser. No. 10/190,689, and "Memory Utilizing Oxide-Conductor Nanolaminates," Ser. No. 10/191,336, each of which disclosure is herein incorporated by reference.

FIELD OF THE INVENTION

The present invention relates generally to semiconductor integrated circuits and, more particularly, to memory utilizing oxide nanolaminates.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell.

Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

With successive generations of DRAM chips, an emphasis continues to be placed on increasing array density and maximizing chip real estate while minimizing the cost of manufacture. It is further desirable to increase array density with little or no modification of the DRAM optimized process flow.

Multilayer insulators have been previously employed in memory devices. (See generally, U.S. Pat. No. 3,877,054, Boulin et al., Apr. 8, 1975, entitled "Semiconductor memory apparatus with a multi-layer insulator contacting the semiconductor," and U.S. Pat. No. 3,964,085, Kahng et al., Jun. 15, 1976, entitled "Method for fabricating multilayer insulator-semiconductor memory apparatus"). The devices in the above references employed oxide-tungsten oxide-oxide layers. Other previously described structures described have employed charge-trapping layers implanted into graded layer insulator structures. (See generally, an article by DiMaria, D. J., "Graded or stepped energy band-gap-insulator MIS structures (GI-MIS or SI-MIS)," Journal of Applied Physics, 50(9), 5826-9 (September 1979); U.S. Pat. No. 4,217,601, DeKeersmaecker et al., Aug. 12, 1980, entitled "Non-volatile memory devices fabricated from graded or stepped energy band gap insulator MIM or MIS structure," also U.S. Pat. No. RE31,083 DeKeersmaecker et al., Nov. 16, 1982, "Non-volatile memory devices fabricated from graded or stepped energy band gap insulator MIM or MIS structure;" and U.S. Pat. No. 5,768,192 Eitan, Jun. 16, 1998, entitled "Non-volatile semiconductor memory cell utilizing asymmetrical charge trapping").

More recently oxide-nitride-oxide structures have been described for high density nonvolatile memories. (See generally, Etian, B. et al., "NROM: A novel localized Trapping, 2-Bit Nonvolatile Memory Cell," IEEE Electron Device Lett., 21(11), 543-545 (November 2000), and Eitan, B. et al., "Characterization of Channel Hot Electron Injection by the Subthreshold Slope of NROM device, IEEE Electron Device Lett., 22(11), 556-558 (November 2001)). All of these are variations on the original MNOS memory structure (see generally, Frohman-Bentchkowsky, D., "An integrated metal-nitride-oxide-silicon (MNOS) memory," Proceedings of the IEEE, 57(6), 1190-2 (June 1969)) described by Fairchild Semiconductor in 1969 which was conceptually generalized to include trapping insulators in general for constructing memory arrays. (See generally, U.S. Pat. No. 3,665,423 Nakamuma et al., May 23, 1972, entitled "Memory matrix using MIS semiconductor element").

Studies of charge trapping in MNOS structures have also been conducted by White and others. (See generally, White, M. H., "Direct tunneling in metal-nitride-oxide-silicon (MNOS) structures," Conference: Program of the 31st physical electronics conference (abstracts), page: 1 pp., Publisher: U.S. Dept. Commerce, Washington, D.C., USA, 1971, viii+46 Pages, Sponsor: American Phys. Soc., division of electron and atomic phys, 15-17 Mar. 1971, Gaithersburg, Md., USA; White, M. H., Cricchi, J. R., "Characterization of thin-oxide MNOS memory transistors," IEEE Transactions on Electron Devices, ED-19(12), 1280-8 (December 1972), Wei, L. S., Simmons, J. G. "Trapping, emission and generation in MNOS memory devices," Solid-State Electronics, 17(6), 591-8 (June 1974), Ferris-Prabhu, A. V., "Charge transfer in layered insulators," Solid-State Electronics, 16(9), 1086-7 (September 1973); Ferris-Prabhu, A. V., Lareau, L. J., "Amnesia in layered insulator FET memory devices," Conference: 1973 International Electron Devices Meeting Technical Digest, Page: 75-7, Publisher: IEEE, New York, N.Y., USA, 1973, xvi+575 Pages, Sponsor: IEEE, 3-5 Dec. 1973, Washington, D.C., USA; Ferris-Prabhu, A. V., "Tunneling theories of non-volatile semiconductor memories," Physica Status Solidi A, 35(1), 243-50 (16 May 1976)).

Some commercial and military applications utilized nonvolatile MNOS memories. (See generally, Britton, J. et al., "Metal-nitride-oxide IC memory retains data for meter reader," Electronics, 45(22); 119-23 (23 Oct. 1972); and Cricchi, J. R. et al., "Hardened MNOS/SOS electrically reprogrammable nonvolatile memory," IEEE Transactions on Nuclear Science, ns-24(6), 2185-9 (December 1977), Conference: IEEE Annual Conference on Nuclear and Space Radiation Effects, Sponsor: IEEE, 12-15 Jul. 1977, Williamsburg, Va., USA).

However, these structures did not gain widespread acceptance and use due to their variability in characteristics and unpredictable charge trapping phenomena. They all depended upon the trapping of charge at interface states between the oxide and other insulator layers or poorly characterized charge trapping centers in the insulator layers themselves. Since the layers were deposited by CVD, they are thick, have poorly controlled thickness and large surface state charge-trapping center densities between the layers.

Thus, there is an ongoing need for improved DRAM technology compatible transistor cells. It is desirable that such transistor cells be fabricated on a DRAM chip with little or no modification of the DRAM process flow. It is further desirable that such transistor cells provide increased density and high access and read speeds.

SUMMARY OF THE INVENTION

The above mentioned problems for creating DRAM technology compatible transistor cells as well as other problems are addressed by the present invention and will be understood by reading and studying the following specification. This disclosure describes the use of oxide insulator nanolaminate layers with charge trapping in potential wells formed by the different electron affinities of the insulator layers. Two different types of materials are used for the nanolaminated insulator layers. The two different types of materials are transition metal oxides and silicon oxycarbide. In the case of transition metal oxide layers, these are formed by ALD and have atomic dimensions, or nanolaminates, with precisely controlled interfaces and layer thickness. In the case of silicon oxycarbide, these are deposited using chemical vapor deposition techniques since an ALD process has not yet been developed.

In particular, an embodiment of the present invention includes a transistor utilizing oxide nanolaminates. The transistor includes a first source/drain region, a second source/drain region, and a channel region therebetween. A gate is separated from the channel region by a gate insulator. The gate insulator includes oxide insulator nanolaminate layers with charge trapping in potential wells formed by different electron affinities of the insulator nanolaminate layers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
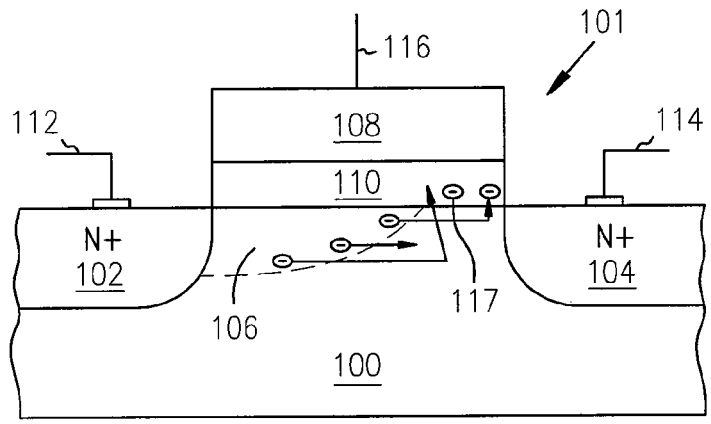
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
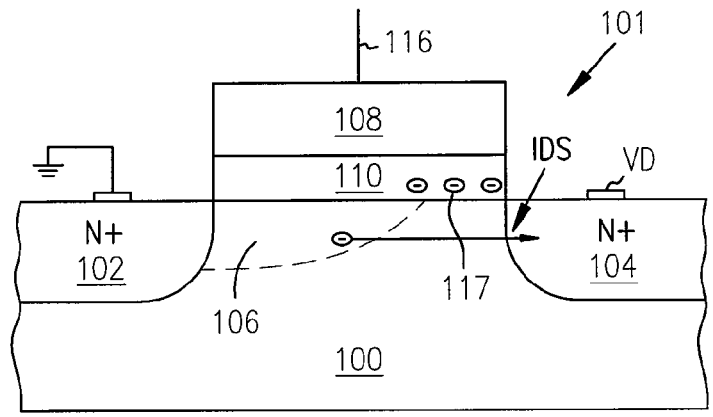
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
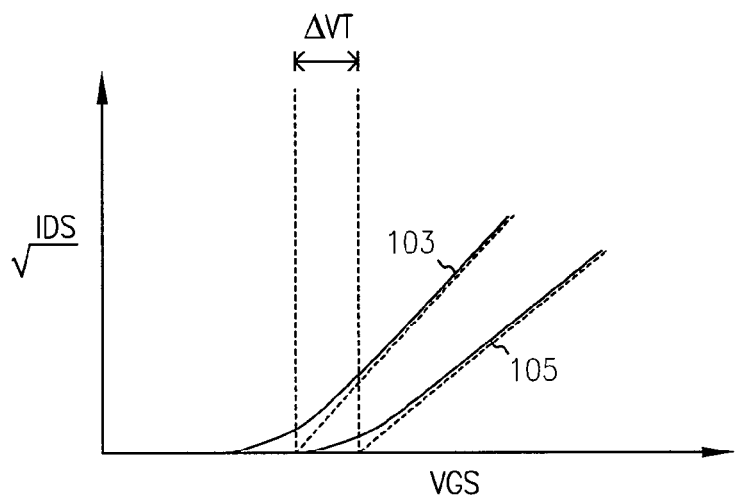
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, $\Delta$VT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 1 represents the charge carrier mobility in the channel 106 for FIG. 1A having no electrons trapped in the gate oxide 110. Slope 2 represents the charge mobility in the channel 106 for the conventional MOSFET of FIG. 1B having electrons 117 trapped in the gate oxide 110 near the drain region 104. As shown by a comparison of slope 1 and slope 2 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventors have previously described programmable memory devices and functions based on the reverse stressing of MOSFET's in a conventional CMOS process and technology in order to form programmable address decode and correction. (See generally, L. Forbes, W. P. Noble and E. H. Cloud, "MOSFET technology for programmable address decode and correction," application Ser. No. 09/383,804). That disclosure, however, did not describe write once read only memory solutions, but rather address decode and correction issues. The inventors also describe write once read only memory cells employing charge trapping in gate insulators for conventional MOSFETs and write once read only memory employing floating gates. The same are described in co-pending, commonly assigned U.S. patent applications, entitled "Write Once Read Only Memory Employing Charge Trapping in Insulators," Ser. No. 10/177,077, and "Write Once Read Only Memory Employing Floating Gates," Ser. No. 10/177,083. The present application, however, describes transistor cells having oxide insulator nanolaminate layers and used in integrated circuit device structures.

According to the teachings of the present invention, normal flash memory type cells can be programmed by operation in the reverse direction and utilizing avalanche hot electron injection to trap electrons in the gate insulator nanolaminate. When the programmed floating gate transistor is subsequently operated in the forward direction the electrons trapped in the gate insulator nanolaminate cause the channel to have a different threshold voltage. The novel programmed flash memory type transistors of the present invention conduct significantly less current than conventional flash cells which have not been programmed. These electrons will remain trapped in the gate insulator nanolaminate unless negative control gate voltages are applied. The electrons will not be removed from the gate insulator nanolaminate when positive or zero control gate voltages are applied. Erasure can be accomplished by applying negative control gate voltages and/or increasing the temperature with negative control gate bias applied to cause the trapped electrons in the gate insulator nanolaminate to be re-emitted back into the silicon channel of the MOSFET.

Figure 2A:
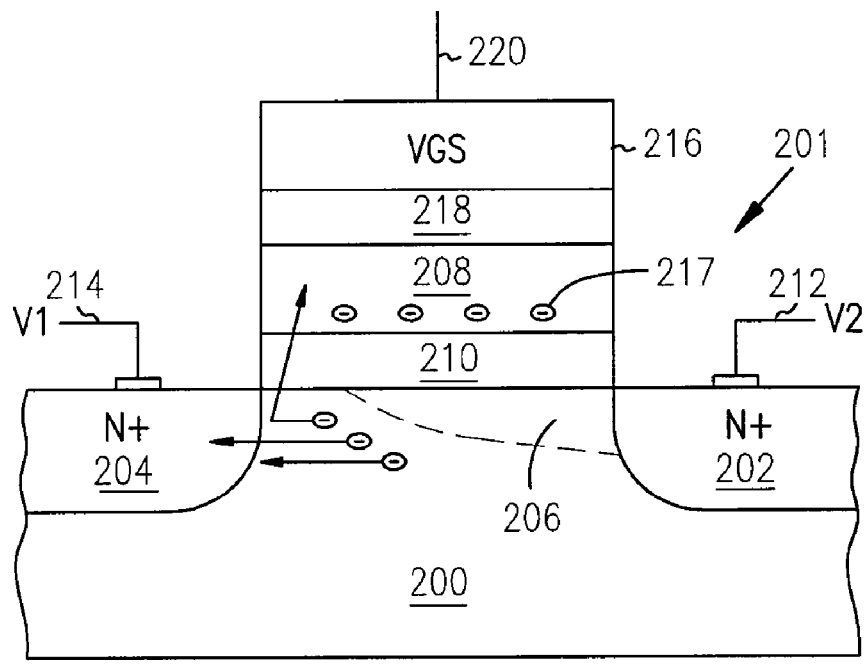
FIG. 2A is a diagram of an embodiment for a programmed MOSFET, having oxide insulator nanolaminate layers, which can be used as a transistor cell according to the teachings of the present invention.

FIG. 2A is a diagram of an embodiment for a programmed transistor cell 201 having oxide insulator nanolaminate layers according to the teachings of the present invention. As shown in FIG. 2A the transistor cell 201 includes a transistor in a substrate 200 which has a first source/drain region 202, a second source/drain region 204, and a channel region 206 between the first and second source/drain regions, 202 and 204. In one embodiment, the first source/drain region 202 includes a source region 202 for the transistor cell 201 and the second source/drain region 204 includes a drain region 204 for the transistor cell 201. FIG. 2A further illustrates the transistor cell 201 having oxide insulator nanolaminate layers 208 separated from the channel region 206 by an oxide 210. An sourceline or array plate 212 is coupled to the first source/drain region 202 and a transmission line 214 is coupled to the second source/drain region 204. In one embodiment, the transmission line 214 includes a bit line 214. Further as shown in FIG. 2A, a gate 216 is separated from the oxide insulator nanolaminate layers 208 by another oxide 218.

As stated above, transistor cell 201 illustrates an embodiment of a programmed transistor. This programmed transistor has a charge 217 trapped in potential wells in the oxide insulator nanolaminate layers 208 formed by the different electron affinities of the insulators 208, 210 and 218. In one embodiment, the charge 217 trapped on the floating gate 208 includes a trapped electron charge 217.

Figure 2B:
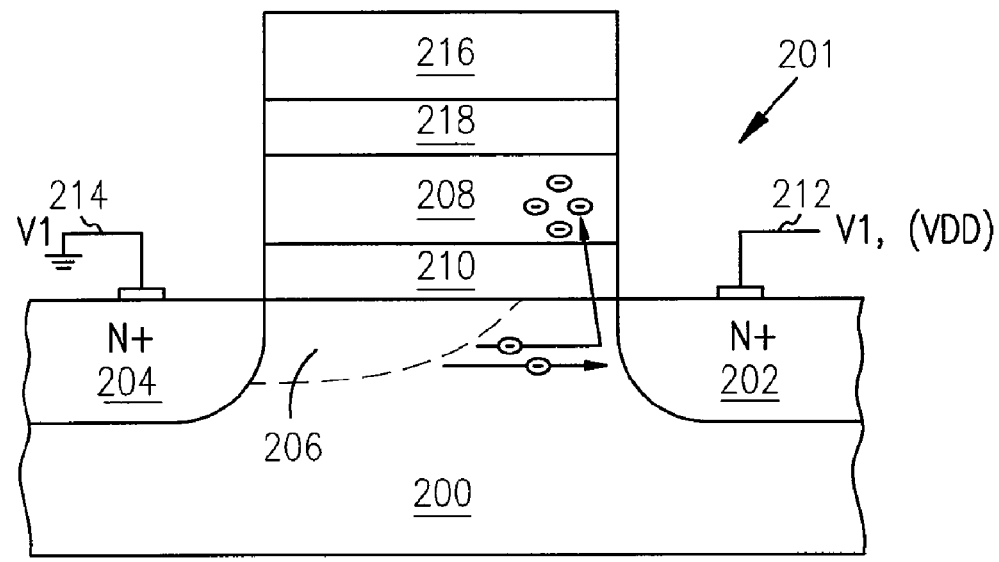
FIG. 2B is a diagram suitable for explaining a method embodiment by which a MOSFET, having oxide insulator nanolaminate layers, can be programmed to achieve the embodiments of the present invention.

FIG. 2B is a diagram suitable for explaining the method by which the oxide insulator nanolaminate layers 208 of the transistor cell 201 of the present invention can be programmed to achieve the embodiments of the present invention. As shown in FIG. 2B the method includes programming the floating gate transistor. Programming the floating gate transistor includes applying a first voltage potential V1 to a drain region 204 of the floating gate transistor and a second voltage potential V2 to the source region 202.

In one embodiment, applying a first voltage potential V1 to the drain region 204 of the floating gate transistor includes grounding the drain region 204 of the floating gate transistor as shown in FIG. 2B. In this embodiment, applying a second voltage potential V2 to the source region 202 includes biasing the array plate 212 to a voltage higher than VDD, as shown in FIG. 2B. A gate potential VGS is applied to the control gate 216 of the transistor. In one embodiment, the gate potential VGS includes a voltage potential which is less than the second voltage potential V2, but which is sufficient to establish conduction in the channel 206 of the transistor between the drain region 204 and the source region 202. As shown in FIG. 2B, applying the first, second and gate potentials (V1, V2, and VGS respectively) to the transistor creates a hot electron injection into the oxide insulator nanolaminate layers 208 of the transistor adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the oxide insulator nanolaminate layers 208 adjacent to the source region 202. Here the charge carriers become trapped in potential wells in the oxide insulator nanolaminate layers 208 formed by the different electron affinities of the insulators 208, 210 and 218.

In an alternative embodiment, applying a first voltage potential V1 to the drain region 204 of the transistor includes biasing the drain region 204 of the transistor to a voltage higher than VDD. In this embodiment, applying a second voltage potential V2 to the source region 202 includes grounding the sourceline or array plate 212. A gate potential VGS is applied to the control gate 216 of the transistor. In one embodiment, the gate potential VGS includes a voltage potential which is less than the first voltage potential V1, but which is sufficient to establish conduction in the channel 206 of the transistor between the drain region 204 and the source region 202. Applying the first, second and gate potentials (V1, V2, and VGS respectively) to the transistor creates a hot electron injection into the oxide insulator nanolaminate layers 208 of the transistor adjacent to the drain region 204. In other words, applying the first, second and gate potentials (V1, V2, and VGS respectively) provides enough energy to the charge carriers, e.g. electrons, being conducted across the channel 206 that, once the charge carriers are near the drain region 204, a number of the charge carriers get excited into the oxide insulator nanolaminate layers 208 adjacent to the drain region 204. Here the charge carriers become trapped in potential wells in the oxide insulator nanolaminate layers 208 formed by the different electron affinities of the insulators 208, 210 and 218, as shown in FIG. 2A.

In one embodiment of the present invention, the method is continued by subsequently operating the transistor in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the oxide insulator nanolaminate layers 208. That is, a gate potential can be applied to the gate 216 by a wordline 220 in an effort to form a conduction channel between the source and the drain regions as done with addressing and reading conventional DRAM cells.

However, now in its programmed state, the conduction channel 206 of the transistor will have a higher voltage threshold and will not conduct.

Figure 2C:
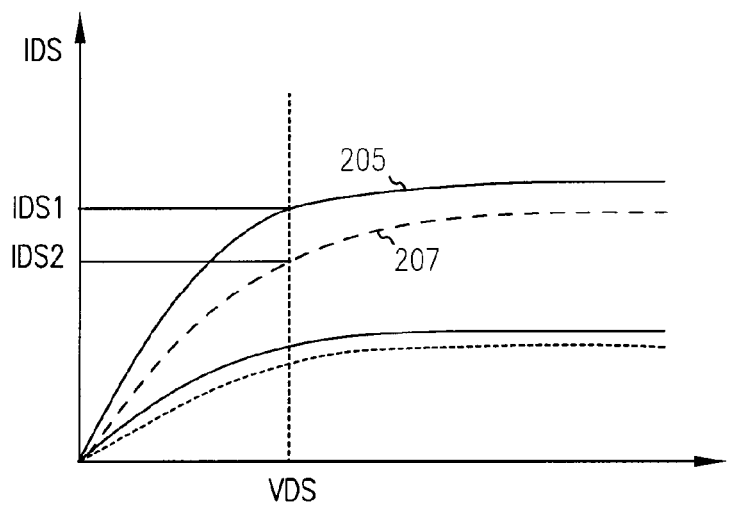
FIG. 2C is a graph plotting the current signal (Ids) detected at the drain region versus a voltage potential, or drain voltage, (VDS) set up between the drain region and the source region (Ids vs. VDS).

FIG. 2C is a graph plotting a current signal (IDS) detected at the second source/drain region 204 versus a voltage potential, or drain voltage, (VDS) set up between the second source/drain region 204 and the first source/drain region 202 (IDS vs. VDS). In one embodiment, VDS represents the voltage potential set up between the drain region 204 and the source region 202. In FIG. 2C, the curve plotted as D1 represents the conduction behavior of a conventional transistor which is not programmed according to the teachings of the present invention. The curve D2 represents the conduction behavior of the programmed transistor, described above in connection with FIG. 2A, according to the teachings of the present invention. As shown in FIG. 2C, for a particular drain voltage, VDS, the current signal (IDS2) detected at the second source/drain region 204 for the programmed transistor (curve D2) is significantly lower than the current signal (IDS1) detected at the second source/drain region 204 for the conventional transistor cell which is not programmed according to the teachings of the present invention. Again, this is attributed to the fact that the channel 206 in the programmed transistor of the present invention has a different voltage threshold.

Some of these effects have recently been described for use in a different device structure, called an NROM, for flash memories. This latter work in Israel and Germany is based on employing charge trapping in a silicon nitride layer in a non-conventional flash memory device structure. (See generally, B. Eitan et al., "Characterization of Channel. Hot Electron Injection by the Subthreshold Slope of NROM device," IEEE Electron Device Lett., Vol. 22, No. 11, pp. 556-558, (November 2001); B. Etian et al., "NROM: A novel localized Trapping, 2-Bit Nonvolatile Memory Cell," IEEE Electron Device Lett., Vol. 21, No. 11, pp. 543-545, (November 2000)). Charge trapping in silicon nitride gate insulators was the basic mechanism used in MNOS memory devices (see generally, S. Sze, Physics of Semiconductor Devices, Wiley, N.Y., 1981, pp. 504-506), charge trapping in aluminum oxide gates was the mechanism used in MIOS memory devices (see generally, S. Sze, Physics of Semiconductor Devices, Wiley, N.Y., 1981, pp. 504-506), and the present inventors have previously disclosed charge trapping at isolated point defects in gate insulators (see generally, L. Forbes and J. Geusic, "Memory using insulator traps," U.S. Pat. No. 6,140,181, issued Oct. 31, 2000). However, none of the above described references addressed forming transistor cells utilizing charge trapping in potential wells in oxide insulator nanolaminate layers formed by the different electron affinities of the insulators.

Figure 3:
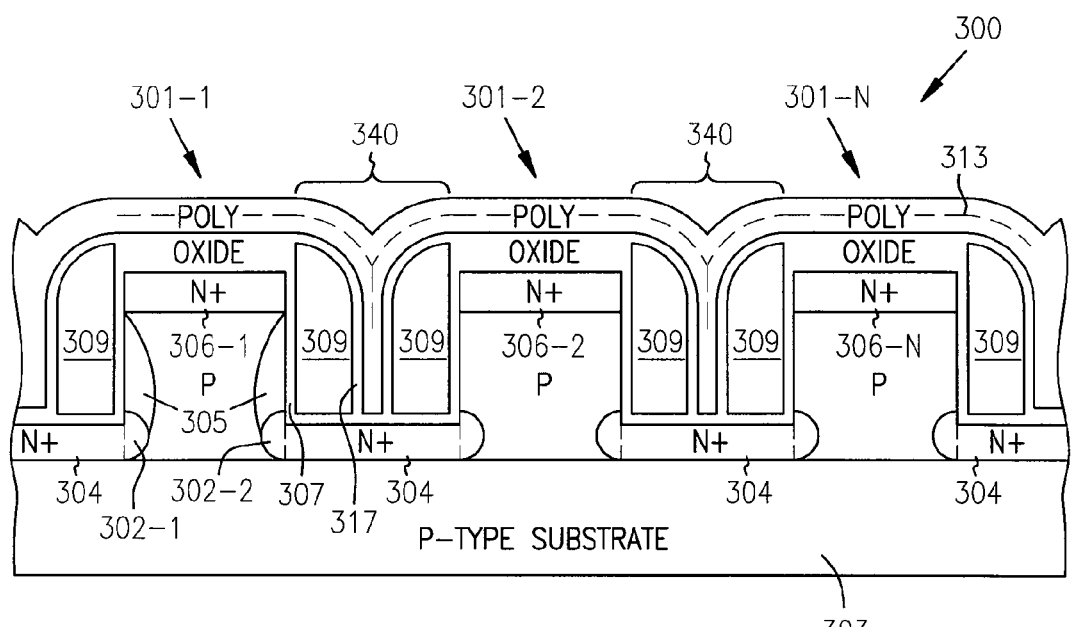
FIG. 3 illustrates a portion of an embodiment of a memory array according to the teachings of the present invention.

FIG. 3 illustrates an embodiment for a portion of a memory array 300 according to the teachings of the present invention. The memory in FIG. 3, is shown illustrating a number of vertical pillars, or transistor cells, 301-1, 301-2, ..., 301-N, formed according to the teachings of the present invention. As one of ordinary skill in the art will appreciate upon reading this disclosure, the number of vertical pillar are formed in rows and columns extending outwardly from a substrate 303. As shown in FIG. 3, the number of vertical pillars, 301-1, 301-2, ..., 301-N, are separated by a number of trenches 340. According to the teachings of the present invention, the number of vertical pillars, 301-1, 301-2, ..., 301-N, serve as transistors including a first source/drain region, e.g. 302-1 and 302-2 respectively. The first source/drain region, 302-1 and 302-2, is coupled to a sourceline 304. As shown in FIG. 3, the sourceline 304 is formed in a bottom of the trenches 340 between rows of the vertical pillars, 301-1, 301-2, ..., 301-N. According to the teachings of the present invention, the sourceline 304 is formed from a doped region implanted in the bottom of the trenches 340. A second source/drain region, e.g. 306-1 and 306-2 respectively, is coupled to a bitline (not shown). A channel region 305 is located between the first and the second source/drain regions.

As shown in FIG. 3, oxide insulator nanolaminate layers, shown generally as 309, are separated from the channel region 305 by a first oxide layer 307 in the trenches 340 along rows of the vertical pillars, 301-1, 301-2, ..., 301-N. In the embodiment shown in FIG. 3, a wordline 313 is formed across the number of pillars and in the trenches 340 between the oxide insulator nanolaminate layers 309. The wordline 313 is separated from the pillars and the oxide insulator nanolaminate layers 309 by a second oxide layer 317.

Figure 4:
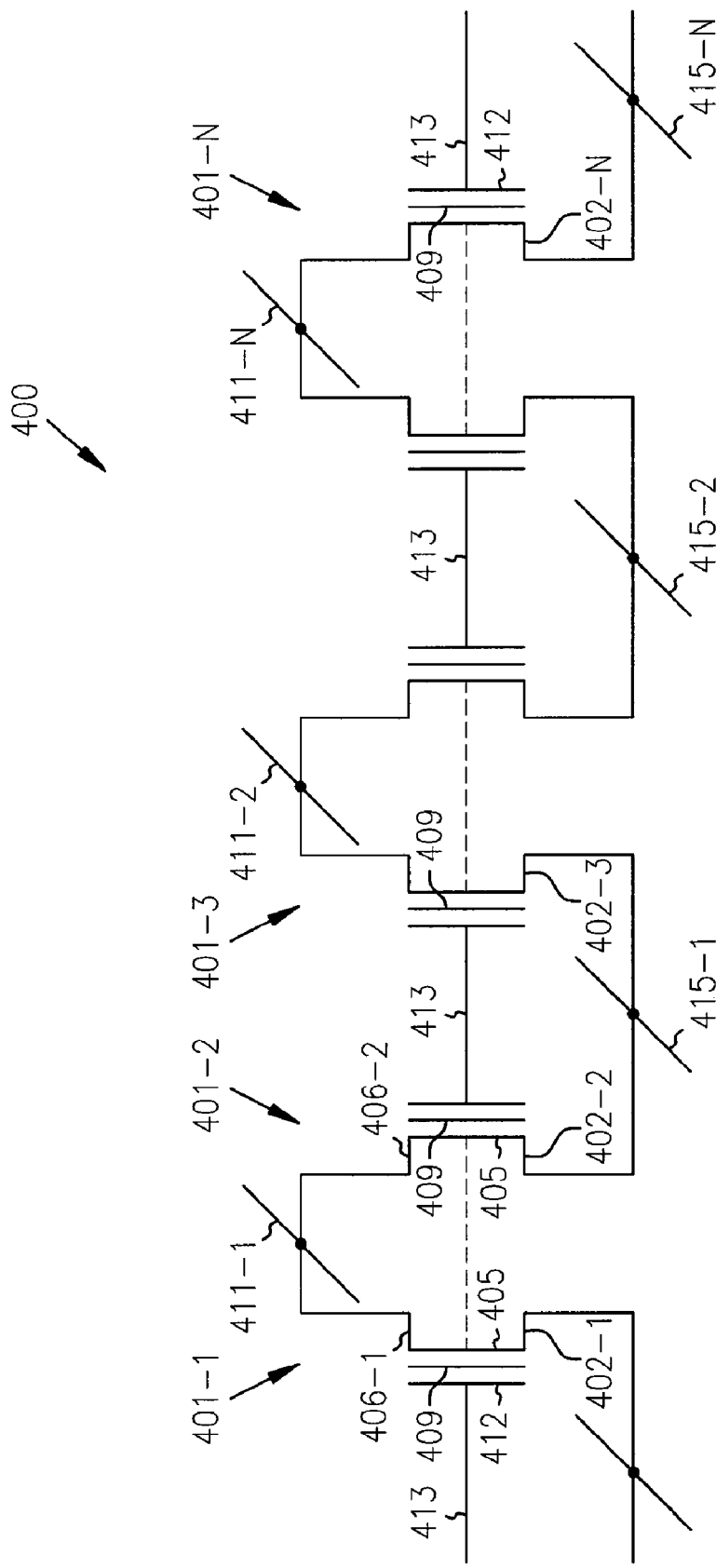
FIG. 4 illustrates an electrical equivalent circuit 400 for the portion of the memory array shown in FIG. 3.

FIG. 4 illustrates an electrical equivalent circuit 400 for the portion of the memory array shown in FIG. 3. As shown in FIG. 4, a number of vertical transistor cells, 401-1, 401-2, ..., 401-N, are provided. Each vertical transistor cell, 401-1, 401-2, ..., 401-N, includes a first source/drain region, e.g. 402-1 and 402-2, a second source/drain region, e.g. 406-1 and 406-2, a channel region 405 between the first and the second source/drain regions, and oxide insulator nanolaminate layers, shown generally as 409, separated from the channel region by a first oxide layer.

FIG. 4 further illustrates a number of bit lines, e.g. 411-1 and 411-2. According to the teachings of the present invention as shown in the embodiment of FIG. 4, a single bit line, e.g. 411-1 is coupled to the second source/drain regions, e.g. 406-1 and 406-2, for a pair of transistor cells 401-1 and 401-2 since, as shown in FIG. 3, each pillar contains two transistor cells. As shown in FIG. 4, the number of bit lines, 411-1 and 411-2, are coupled to the second source/drain regions, e.g. 406-1 and 406-2, along rows of the memory array. A number of word lines, such as wordline 413 in FIG. 4, are coupled to a gate 412 of each transistor cell along columns of the memory array. According to the teachings of the present invention, a number of sourcelines, 415-1, 415-2, ..., 415-N, are formed in a bottom of the trenches between rows of the vertical pillars, described in connection with FIG. 3, such that first source/drain regions, e.g. 402-2 and 402-3, in column adjacent transistor cells, e.g. 401-2 and 401-3, separated by a trench, share a common sourceline, e.g. 415-1. And additionally, the number of sourcelines, 415-1, 415-2, ..., 415-N, are shared by column adjacent transistor cells, e.g. 401-2 and 401-3, separated by a trench, along rows of the memory array 400. In this manner, by way of example and not by way of limitation referring to column adjacent transistor cells, e.g. 401-2 and 401-3, separated by a trench, when one column adjacent transistor cell, e.g. 401-2, is being read its complement column adjacent transistor cell, e.g. 401-3, can operate as a reference cell.

Method of Formation

This disclosure describes the use of oxide insulator nanolaminate layers with charge trapping in potential wells formed by the different electron affinities of the insulator layers. Two different types of materials are used for the nanolaminated insulator layers, transition metal oxides and silicon oxycarbide. (See generally, Wilk, G. D. et al., "High-k gate dielectric: Current status and materials properties considerations," *Jour. Appl. Phys.*, 89(10), 5243-75 (2001); Robertson, J., "Band offsets of wide-band-gap oxides and implications for future electronic devices," *J. Vac. Sci. Technol. B*, 18(3), 1785-91 (2000); Luan, H. F. et al., "High quality Ta$_2$O$_5$ gate dielectrics with T$_{ox}$ equil. 10 Angstroms," *IEDM Tech. Digest*, 141-144 (1999); Zhu, W. J. et al., "Current transport in metal/hafnium oxide/silicon structure," *IEEE Electron Device Letters*, 23(2), 97-99 (2002) for discussion on transition metal properties). (See generally, Yoder, M. N., "Wide bandgap semiconductor materials and devices," *IEEE Trans. on Electron Devices*, 43, 1633-36 (October 1996); Ahn, K. Y. and Forbes, L., "Porous silicon oxycarbide integrated circuit insulator," U.S. Pat. No. 6,313,518; Forbes, L. et al., "Transistor with silicon oxycarbide gate and methods of fabrication and use," U.S. Pat. No. 5,886,368, for discussion on silicon oxycarbide properties).

In the case of transition metal oxide layers, in embodiments of the present invention these are formed by ALD and have atomic dimensions, or nanolaminates, with precisely controlled interfaces and layer thickness. In the case of silicon oxycarbide, in embodiments of the present invention these are deposited using chemical vapor deposition techniques since an ALD process has not yet been developed.

Transition Metal Oxides
Atomic Layer Deposition

Embodiments of the present invention use the atomic controlled deposition method to form the gate insulators if transition metal oxides are employed for the electron trapping layer. Atomic Layer Deposition (ALD), developed in the early 70s, is a modification of CVD and can also be called as "alternately pulsed-CVD." (See generally, Ofer Sneh et al., "Thin film atomic layer deposition equipment for semiconductor processing," *Thin Solid Films*, 402, 248-261 (2002)). Gaseous precursors are introduced one at a time to the substrate surface, and between the pulses the reactor is purged with an inert gas or evacuated. In the first reaction step, the precursor is saturatively chemisorbed at the substrate surface, and during the subsequent purging the precursor is removed from the reactor. In the second step, another precursor is introduced on the substrate and the desired films growth reaction takes place. After that the reaction byproducts and the precursor excess are purged out from the reactor. When the precursor chemistry is favorable, i.e., the precursor adsorb and react with each other aggressively, one ALD cycle can be preformed in less than one second in the properly designed flow type reactors.

The striking feature of ALD is the saturation of all the reaction and purging steps which makes the growth self-limiting. This brings the large area uniformity and conformality, the most important properties of ALD, as shown in very different cases, viz. planar substrates, deep trenches, and in the extreme cases of porous silicon and high surface area silica and alumina powers. Also the control of the film thickness is straightforward and can be made by simply calculating the growth cycles. ALD was originally developed to manufacture luminescent and dielectric films needed in electroluminescent displays, and a lot of effort has been put to the growth of doped zinc sulfide and alkaline earth metal sulfide films. Later ALD has been studied for the growth of different epitaxial II-V and II-V1 films, nonepitaxial crystalline or amorphous oxide and nitride films are their multilayer structures. There has been considerable interest towards the ALD growth of silicon and germanium films but due to the difficult precursor chemistry, the results have not been very successful.

Reaction sequence ALD (RS-ALD) films have several unique and unmatched advantages:
Continuity at the interface avoiding poorly defined nucleating regions that are typical for CVD (<20 Å) and PVD (<50 Å) films. To achieve this continuity, the substrate surface must be activated to react directly with the first exposure of RS-ALD precursor.

Unmatched conformality over toughest substrate topologies with robust processes that can only be achieved with a layer-by-layer deposition technique.

Typically, low temperature and mildly oxidizing processes. This is thought to be a major advantage for gate insulator processing where deposition of non-silicon based dielectrics without oxidizing the substrate (with the oxidation-precursor) is a major concern.

RS-ALD ability to engineer multilayer laminate films, possibly down to monolayer resolution, as well as alloy composite films appear to be unique. This ability comes from the combination of being able to control deposition with monolayer precision and the ability to deposit continuous monolayers of amorphous films (that is unique to RS-ALD).

Unprecedented process robustness. RS-ALD processes are free of first wafer effects and the chamber dependence. Accordingly, RS-ALD processes will be easier to transfer from development to production and from 200 to 300 mm wafer size.

Thickness depends solely on the number of cycles. Thickness can be "dialed in" as a simple recipe change bearing no need for additional process development upon technology generation advance.

(See generally, Shunsuke Morishita et al., "Atomic-Layer Chemical-Vapor-Deposition of $SiO_2$ by Cyclic Exposure of $CH_3OSi(NCO)_3$ and $H_2O_2$," Jpn. J. Appl. Phys., 34, 5738-42 (1955)).

ALD Processes for Disclosed Structure with Transition Metal Oxides

Figure 5:
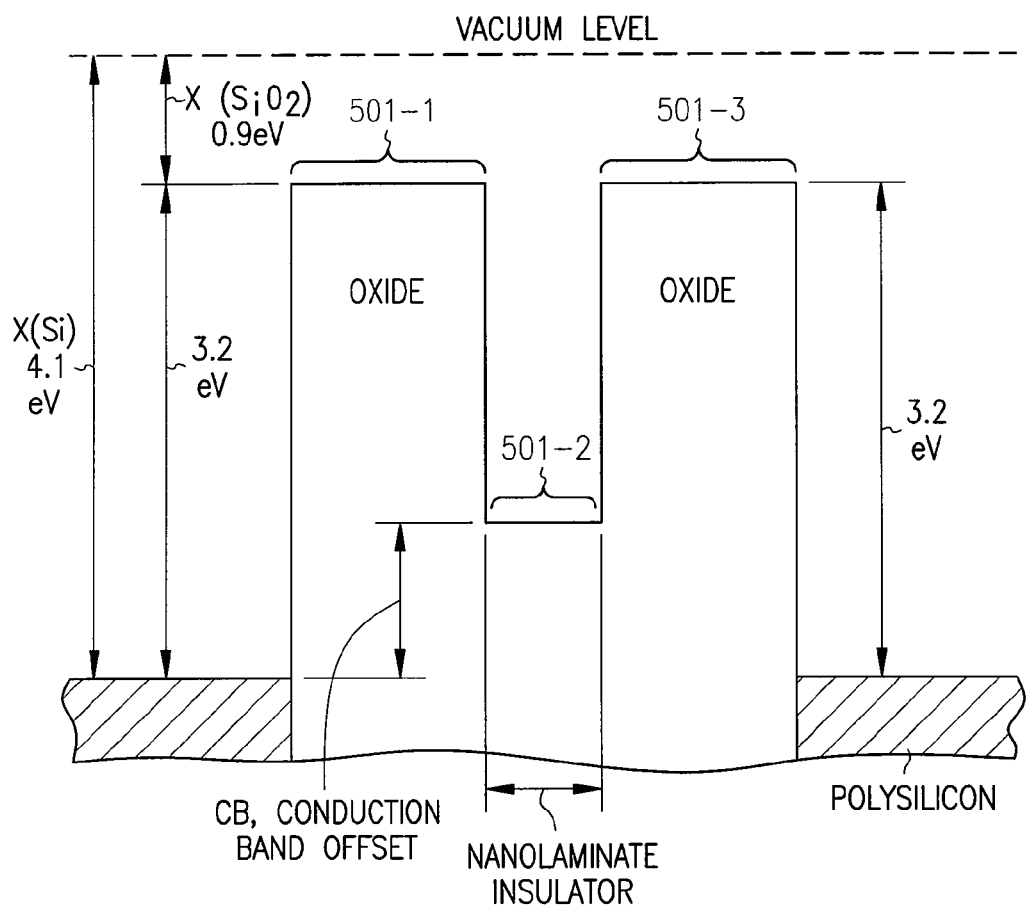
FIG. 5 illustrates an energy band diagram for an embodiment of a gate stack according to the teachings of the present invention.

FIG. 5 illustrates an energy band diagram for an embodiment of a gate stack according to the teachings of the present invention. As shown in FIG. 5, the embodiment consists of insulator stacks, 501-1, 501-2 and 501-3, e.g. $SiO_2$/oxide insulator nanolaminate layers/$SiO_2$. The first and the last layer, 501-1 and 501-3, are done by atomic layer deposition. In some embodiments, layers 501-1 and 501-3 are deposited by cyclic exposures of $CH_3OSi(NCO)_3$ and $H_2O_2$ at room temperature. (See generally, Shunsuke Morishita et al., "Atomic-Layer Chemical-Vapor-Deposition of $SiO_2$ by Cyclic Exposure of $CHOSi(NCO)_3$ and $H_2O_2$," Jpn. J. Appl. Phys., 34, 5738-42 (1955)). In this embodiment, the deposition rate is saturated at about 2 Å/cycle, i.e., equal to the ideal quasi-monolayer/cycle. In one example the surface roughness for 100 deposition cycles is found to be less than ±10 Å by atomic force microscopy.

In the Morishita reference, metallic oxides were used. Those metallic oxides included $HfO_2$, $Zr_2O_2$, $Ta_2O_3$, La- and Y-based oxides, $TiO_2$, and $Al_2O_3$ and are discussed in the following paragraphs.

Recently a special technical meeting on 'Atomic Layer Deposition' was held by the American Vacuum Society. (See generally, Forsgren, Katarina et al., "Atomic Layer Deposition of $HfO_2$ using hafnium iodide," one page summary of work, Conference held in Monterey, Calif., May 14-15, 2001). In the printed form, the above reference showed a summary of $HfO_2$ growth using $HfI_4$ for the first time, which results in a high melting material with a low leakage current and dielectric constant of 16-30. Together with a high chemical stability in contact with silicon, this makes $HfO_2$ a possible replacement for $SiO_2$ as a gate oxide. Previous work in the Forsgren group has shown that iodides can be used as metal sources in ALD of high-purity oxide films, e.g., $Ta_2O_5$, $TaO_2$, $ZrO_2$. Their study demonstrates the use of $HfI_4$ in ALD for the first time. In a recent paper by Zhang et al., they published work on thin stacks comprised of alternate layers of $Ta_2O_5/HfO_2$, $Ta_2O_5/ZrO_2$, and $ZrO_2/HfO_2$. (See generally, Zhang, H. and Solanki, R., "Atomic Layer Deposition of High Dielectric Constant Nanolaminates," Jour. of the Electrochemical Soc., 148(4) F63-F66 (2001)). Zhang et al. reported the thin stacks as high-permittivity insulators for possible gate applications. These thin layers were deposited on silicon substrates using atomic layer deposition. Nanolaminate with silicon oxide equivalent thickness of about 2 nm had dielectric constants of around ten and leakage current densities at 1 MV/cm of around $10^{-8}$ A/cm$^2$. Of the three kinds of nanolaminates investigated, $ZrO_2/HfO_2$ structure showed the highest breakdown field and the lowest leakage current. Zhang et al. report that by growing nanolaminates of high-permittivity thin films, leakage current of about $5\times10^{-7}$ A/cm$^2$ and k values of around 10 can be obtained for films of equivalent $SiO_2$ thickness, e.g. less than 3 nm.

In embodiments of the present invention, nanolaminates of $HfO_2$ and $ZrO_2$ are described as a dielectric material in new device structures with silicon oxide-metal oxide-silicon oxide insulator nanolaminates. Films with ALD of $HfO_2$ are prepared with substrate temperature of 225-500° C. using $HfI_4$ as precursor, instead of $HfCl_4$. (See generally, Forsgren, Katarina et al., "Atomic Layer Deposition of $HfO_2$, using hafnium iodide," one page summary of work, Conference held in Monterey, Calif., May 14-15, 2001). Another process temperature for the $HfO_2$ is at 325° C. as practiced by Kukli et al. (See generally, Kukli, Kaupo et al., "Dielectric Properties of Zirconium Oxide Grown by Atomic Layer Deposition from Iodide Precursor," Jour. of the Electrochemical Soc., 148(12), F227-F232 (2001)). For deposition of ALD $ZrO_2$, an alternative precursor of $ZrI_4$ would be used instead of $ZrCl_4$. $ZrO_2$ films were previously grown from $ZrI_4$ and $H_2O$—$H_2O$ using the same atomic layer deposition technique. (See generally, Carter, R. J. et al., "Electrical Characterization of High-k Materials Prepared by Atomic Layer CVD," IWGI, 94-99 (2001)). The breakdown field exceeded 2 MV/cm in the films grown at 325-500° C. The relative permittivity measured at 10 kHz was 20-24 in the films deposited at 275-325° C. The dissipation factor of these films was as low as 0.02-0.03. Thus, for the deposition of nanolaminates, a temperature of 250 to 325° C. would be recommended. Other references for $ZrO_2$ may be useful to note. (See generally, Kukli, Kaupo et al., "Tailoring the dielectric properties of $HfO_2$—$Ta_2O_3$ nanolaminates," Appl. Phys. Lett., 68(26), 3737-39 (1996)).

Guha et al. reported on the electrical and microstructural characteristics of La- and Y-based oxides grown on silicon substrates by ultrahigh vacuum atomic beam deposition. (See generally, Guha, S. et al., "Atomic beam deposition of lanthanum- and yttrium-based oxide thin films for gate dielectrics," Appl. Phys. Lett., 77(17), 2710-2712 (2000)). The Guha et al. group was interested in examining the potential of lanthanum- and yttrium-based oxide thin films as alternate gate dielectrics for Si complementary metal oxide semiconductor technology. Guha et al. examined the issue of the polycrystallinity and interfacial silicon oxide formation in these films and their effect on the leakage currents and the ability to deposit films with low electrical thinness. They found that the interfacial $SiO_2$ is much thicker at ~1.5 nm for the Y-based oxide compared to the La-based oxide where the thickness <0.5 nm. They also showed that while the Y-based oxide films show excellent electrical properties, the La-based films exhibit a large flat band voltage shift indicative of positive charge in the films. In embodiments of the present invention, nanolaminates of $HfO_2$ and $ZrO_2$ are also described as a dielectric material in new device structures with silicon oxide-metal oxide-silicon oxide insulator nanolaminates.

Niilisk et al. studied the initial growth of $TiO_2$ films by ALD. (See generally, Niilisk, A. et al., "Atomic-scale optical monitoring of the initial growth of $TiO_2$ thin films," *Proc. of the SPIE*, 4318, 72-77 (2001)). The initial atomic-layer-chemical-vapor-deposition growth of titanium dioxide from $TiCl_4$ and water on quartz glass substrate was monitored in real time by incremental dielectric reflection. In the Niilisk et al. reference an interesting means for beginning the growth from the very beginning into a time-homogeneous mode was proposed and preliminarily studied. The means for beginning the growth from the very beginning into a time-homogeneous mode consists of an in situ $TiCl_4$-treatment procedure. The crystal structure and surface morphology of the prepared ultrathin films were characterized by Niilisk et al. In embodiments of the present invention, nanolaminates of $TiO_2$ are also described as a dielectric material in new device structures with silicon oxide-metal oxide-silicon oxide insulator nanolaminates.

Further, in embodiments of the present invention, nanolaminates of $Al_2O_3$ are described as a dielectric material for new device structures with silicon oxide-metal oxide-silicon oxide insulator nanolaminates. In these embodiments, $Al_2O_3$ can be deposited by ALD. (See generally, DiMaria, D. J. "Graded or stepped energy band-gap-insulator MIS structures (GI-MIS or SI-MIS)," *Journal of Applied Physics*, 50(9), 5826-9 (September 1979) for one technique appropriate for performing the ALD deposition).

Silicon Oxycarbide

Figure 6:
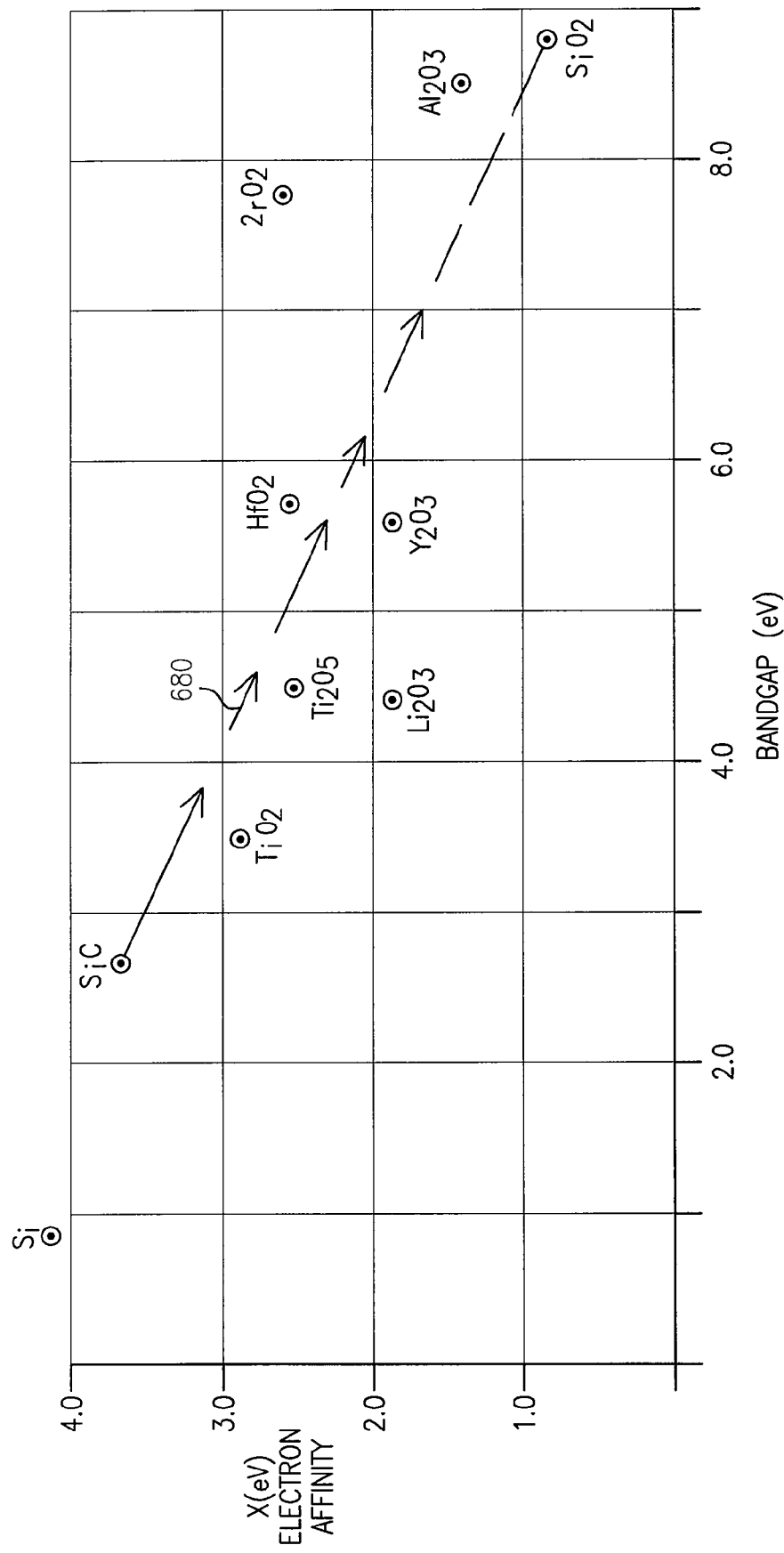
FIG. 6 is a graph which plots electron affinity versus the energy bandgap for various insulators.

Silicon oxycarbide is a wide band gap semiconductor, with a band gap energy which can vary between that of silicon carbide and that of silicon oxide. (See generally, Yoder, M. N., Wide bandgap semiconductor materials and devices," *IEEE Trans. on Electron Devices*, 43, 1633-1636 (October 1996)). FIG. 6 is a graph which plots electron affinity versus the energy bandgap for various insulators. That is FIG. 6 illustrates the inventors estimates of the variation of the electron affinity with the bandgap energy. If the insulator is crystalline and has a small band gap, near that of silicon carbide, then the insulator can be doped and be conductive, however if undoped and in an amorphous state with a larger band gap, it will be an insulator. The inventors of the present case, Ahn, K. Y. and Forbes, L., have previously described silicon oxycarbide for use as an insulator in integrated circuits. (See generally, U.S. Pat. No. 6,313,518, by Ahn, K. Y. and Forbes, L., entitled "Porous silicon oxycarbide integrated circuit insulator"). The inventors of the present case, Ahn, K.Y. and Forbes, L., have previously described doped and microcrystalline silicon oxycarbide to be conductive for use as a gate material. (See generally, U.S. Pat. No. 5,886,368, by Forbes, L. et al., entitled "Transistor with silicon oxycarbide gate and methods of fabrication and use"). Additionally, silicon oxycarbide has been described for passivation of integrated circuit chips. (See generally, U.S. Pat. No. 5,530,581, by S. F. Cogan, entitled "Protective overlay material and electro-optical coating using same").

Silicon oxycarbide can be deposited by chemical vapor deposition, CVD, techniques. (See generally, Fauchet, P. M. et al., "Optoelectronics and photovoltaic applications of microcrystalline SiC," Symp. on Materials Issues in Microcrystalline Semiconductors, pp. 291-2 (1989); Demichelis, F. et al., "Physical properties of undoped and doped microcrystalline SiC:H deposited by PECVD," Symp. on Amorphous Silicon Technology, pp. 413-18 (1991); Demichelis, F. et al., "Influence of doping on the structural and optoelectronic properties of amorphous and microcrystalline silicon carbine," *J. Appl. Phys.*, 72(4), 1327-33 (1992); Chang, C. Y. et al., "Novel passivation dielectrics—the boron—or phosphorus-doped hydrogenated amorphous silicon carbide films," *J. Electrochemical Society*, 132(2), 418-22 (February 1995); Martins, R. et al., "Transport properties of doped silicon oxycarbide microcrystalline films produced by spatial separation techniques," *Solar Energy Materials and Solar Cells*, 41-42, 493-517 (June, 1996); Martins, R. et al., "Wide bandgap microcrystalline silicon thin films," Diffusion Defect Data Part B (Solid State Phenomena), Vol. 44-46, pt. 2, p. 299-346 (1995); Renlund, G. M. et al., "Silicon oxycarbide glasses, I. Preparation and chemistry, *J. Materials Research*, 6(12), 2716-22 (December 1991); Renlund, G. M. et al., "Silicon oxycarbide glasses, II. Structure and properties," *J. Materials Research*, 6(12), 2723-34 (December 1991)). In the silicon oxycarbide embodiments of the present invention, an initial gate oxide is grown by thermal oxidation of silicon and then the silicon oxycarbide and final oxide layer is deposited by CVD.

Memory Devices

According to the teachings of the present invention, the gate insulator structure shown in FIG. 5 is employed in a wide variety of different flash memory type devices. That is, in embodiments of the present invention, the gate structure embodiment of FIG. 5, having silicon oxide-oxide insulator nanolaminates-silicon oxide, is used in place of the gate structure provided in the following commonly assigned U.S. Pat. Nos. 5,936,274; 6,143,636; 5,973,356; 6,238,976; 5,991,225; 6,153,468; and 6,124,729.

In embodiments of the present invention, the gate structure embodiment of FIG. 5, having silicon oxide-oxide insulator nanolaminates-silicon oxide, is used in place of the gate structure provided in the following commonly assigned pending applications: Forbes, L., "Write once read only memory based on DRAM technology employing charge trapping in gate insulators," application Ser. No. 10/177,077; Forbes, L., "Write once read only memory based on a modification of DRAM technology employing floating gates," application Ser. No. 10/177,083; Forbes, L., "Write once read only memory with long retention for archival storage," application Ser. No. 10/177,213; Forbes, L., "Nanoncrystal write once read only memory with long retention for archival storage," application Ser. No. 10/177,214; Forbes, L., "Ferroelectric write once read only memory with long retention for archival storage," application Ser. No. 10/177,082; Forbes, L., "Vertical NROM having a storage density of 1 bit/$1F^2$ flash memory cell," Application Ser. No. 10/177,208; Forbes, L., "Multistate NROM having a storage density much greater than 1 bit/$1F^2$," application Ser. No. 10/177,211; Forbes, L., "NOR flash memory cell with high storage density," application Ser. No. 10/177,483.

According to the teachings of the present invention, embodiments of the novel transistor herein, which are substituted for the gate structures described in the references above, are programmed by grounding a source line and applying a gate voltage and a voltage to the drain to cause channel hot electron injection. To read the memory state, the drain and ground or source have the normal connections and the conductivity of the transistor determined using low voltages so as not to disturb the memory state. The devices can be erased by applying a large negative voltage to the gate.

In embodiments of the present invention, the gate structure embodiment of FIG. 5, having silicon oxide-oxide insulator nanolaminates-silicon oxide, is used in place of the gate structure provided in the following commonly assigned U.S. Pat. Nos. 5,936,274, 6,143,636, 5,973,356 and 6,238,976 (vertical flash memory devices with high density); 5,991,225 and 6,153,468 (programmable memory address and decode circuits); and 6,124,729 (programmable logic arrays).

Further, in embodiments of the present invention, the gate structure embodiment of FIG. 5, having silicon oxide-oxide insulator nanolaminates-silicon oxide, is used in place of the gate structure provided in the following US patents: Etian, B. et al., "NROM: A novel localized Trapping, 2-Bit Nonvolatile Memory Cell," *IEEE Electron Device Lett.*, 21(11), 543-545 (November 2000); Eitan, B. et al., "Characterization of Channel Hot Electron Injection by the Subthreshold Slope of NROM device, *IEEE Electron Device Lett.*, 22(11), 556-558 (November 2001); Maayan, E. et al., "A 512 Mb NROM Flash Data Storage Memory with 8 MB/s Data Rate," Dig. IEEE Int. Solid-State Circuits Conf., 100-101 (2002). In these embodiments, the gate structure embodiment of FIG. 5, having silicon oxide-oxide insulator nanolaminates-silicon oxide used in place of the gate structures in those references, can be programmed in the reverse direction and read in the forward direction to obtain more sensitivity in the device characteristics to the stored charge.

All of the above references are incorporated herein in full. The gate structure embodiment of FIG. 5, having silicon oxide-oxide insulator nanolaminates-silicon oxide, are herein used in place of the gate structure provided in those references to support the various embodiments of the present invention. That is, the present invention incorporates the multitude of device structures described in those references to create a multitude of new embodiments which utilize electron trapping in the insulator nanolaminate gate structure shown in FIG. 5, rather than employing floating gates, as recited in many of the above references.

Sample Operation

Figure 7A:
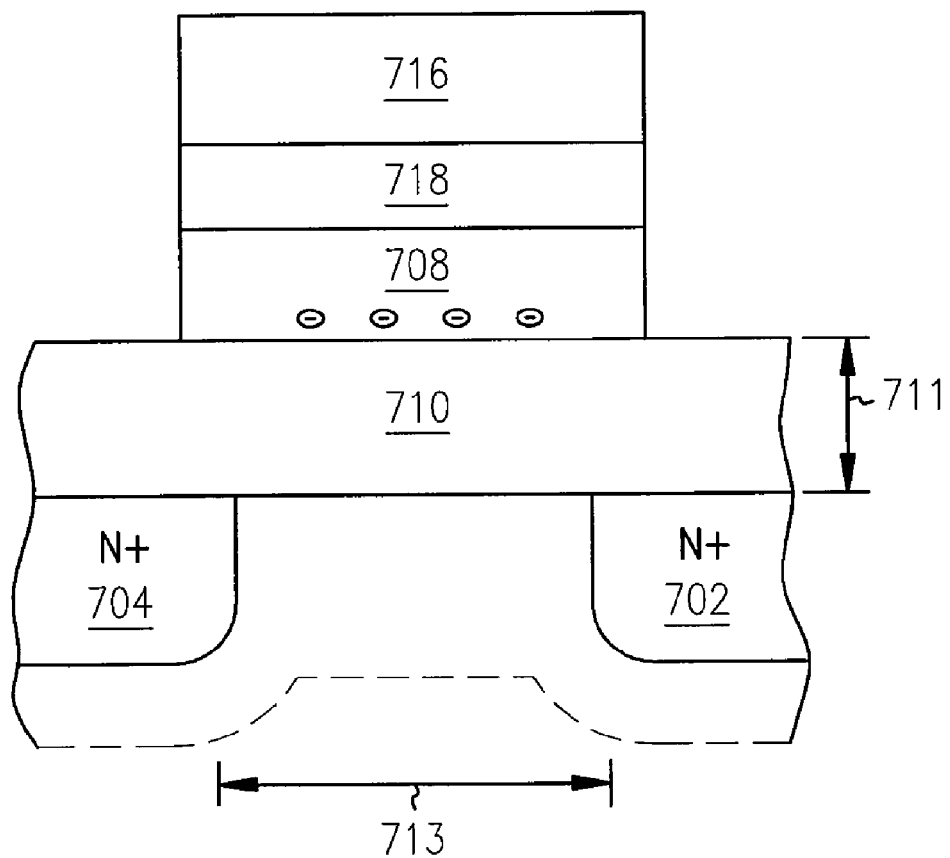
FIGS. 7A-7B illustrates an embodiment for the operation of a transistor cell having oxide insulator nanolaminate layers according to the teachings of the present invention.
Figure 7B:
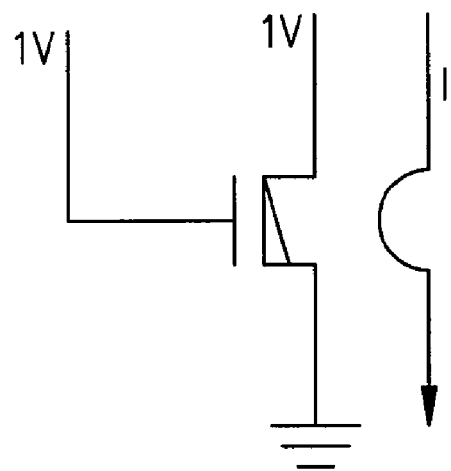
Figure 8:
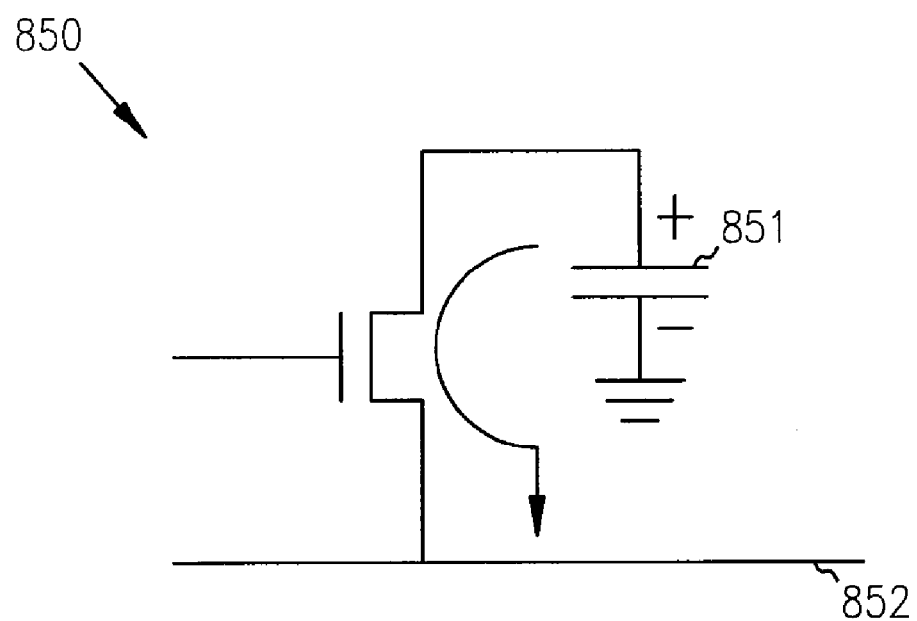
FIG. 8 illustrates the operation of a conventional DRAM cell.

FIGS. 7A-B and 8 are embodiments useful in illustrating the use of charge storage in the oxide insulator nanolaminate layers to modulate the conductivity of the transistor cell according to the teachings of the present invention. That is, FIGS. 7A-7B illustrates the operation of an embodiment for a novel transistor cell 701 formed according to the teachings of the present invention. And, FIG. 8 illustrates the operation of a conventional DRAM cell 701. As shown in FIG. 7A, the embodiment consists of a gate insulator stack having insulator layers, 710, 708 and 718, e.g. $SiO_2$/oxide insulator nanolaminate layers/$SiO_2$. In the embodiment of FIG. 7A, the gate insulator stack having insulator layers, 710, 708 and 718, is made thicker than in a conventional DRAM cell, e.g. 801 and is equal to or greater than 10 nm or 100 Å ($10^{-6}$ cm). In the embodiment shown in FIG. 7A a transistor cell is illustrated having dimensions of 0.1 μm ($10^{-5}$ cm) by 0.1 μm. The capacitance, Ci, of the structure depends on the dielectric constant, $\in_i$, (given here as $0.3 \times 10^{-12}$ F/cm), and the thickness of the insulating layers, t, (given here as $10^{-6}$ cm), such that $Ci=\in i/t$, Farads/cm$^2$ or $3 \times 10^{-7}$ F/cm$^2$. In one embodiment, a charge of $10^{12}$ electrons/cm$^2$ is programmed into the oxide insulator nanolaminate layers of the transistor cell. Here the charge carriers become trapped in potential wells in the oxide insulator nanolaminate layers 708 formed by the different electron affinities of the insulators 710, 708 and 718, as shown in FIG. 7A. This produces a stored charge $\Delta Q=10^{12}$ electrons/cm$^2 \times 1.6 \times 10^{-19}$ Coulombs. In this embodiment, the resulting change in the threshold voltage ($\Delta Vt$) of the transistor cell will be approximately 0.5 Volts ($\Delta Vt=\Delta Q/Ci$ or $1.6 \times 10^{-7}/3 \times 10^{-7}=\frac{1}{2}$ Volt). For $\Delta Q=10^{12}$ electrons/cm$^3$ in the dimensions given above, this embodiment of the present invention involves trapping a charge of approximately 100 electrons in the oxide insulator nanolaminate layers 708 of the transistor cell.

FIG. 7B aids to further illustrate the conduction behavior of the novel transistor cell of the present invention. As one of ordinary skill in the art will understand upon reading this disclosure, if the transistor cell is being driven with a control gate voltage of 1.0 Volt (V) and the nominal threshold voltage without the floating gate charged is ½ V, then if the oxide insulator nanolaminate layers are charged the transistor cell of the present invention will be off and not conduct. That is, by trapping a charge of approximately 100 electrons in the oxide insulator nanolaminate layers of the transistor cell, having dimensions of 0.1 μm ($10^{-5}$ cm) by 0.1 μm, will raise the threshold voltage of the transistor cell to 1.0 Volt and a 1.0 Volt control gate potential will not be sufficient to turn the device on, e.g. Vt=1.0 V, I=0.

Conversely, if the nominal threshold voltage without the oxide insulator nanolaminate layers charged is ½ V, then $I=\mu C_{ox} \times (W/L) \times ((Vgs-Vt)^2/2)$, or 12.5 μA, with $\mu C_{ox}=\mu C_i=100$ μA/V$^2$ and W/L=1. That is, the transistor cell of the present invention, having the dimensions describe above will produce a current I=100 μA/V$^2 \times (\frac{1}{4}) \times (\frac{1}{2}) = 12.5$ μA. Thus, in the present invention an un-written, or un-programmed transistor cell can conduct a current of the order 12.5 μA, whereas if the oxide insulator nanolaminate layers are charged then the transistor cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM with 30 femtoFarad (fF) storage capacitors charged to 50 femto-Columbs (fC), if these are read over 5 nS then the average current on the bit line is only 10 μA. This is illustrated in connection with FIG. 8. As shown in FIG. 8, storing a 50 fC charge on the storage capacitor equates to storing 300,000 electrons.

According to the teachings of the present invention, the transistor cells, having the gate structure with oxide insulator nanolaminate layers, in the array are utilized not just as passive on or off switches as transfer devices in DRAM arrays but rather as active devices providing gain. In the present invention, to program the transistor cell "off," requires only a stored charge in the oxide insulator nanolaminate layers of about 100 electrons if the area is 0.1 μm by 0.1 μm. And, if the transistor cell is un-programmed, e.g. no stored charge trapped in the oxide insulator nanolaminate layers, and if the transistor cell is addressed over 10 nS a current of 12.5 μA is provided. The integrated drain current then has a charge of 125 fC or 800,000 electrons. This is in comparison to the charge on a DRAM capacitor of 50 fC which is only about 300,000 electrons. Hence, the use of transistor cells, having the gate structure with oxide insulator nanolaminate layers, in the array as active devices with gain, rather than just switches, provides an amplification of the stored charge, in the oxide insulator nanolaminate layers, from 100 to 800,000 electrons over a read address period of 10 nS.

Sample Device Applications

Figure 9:
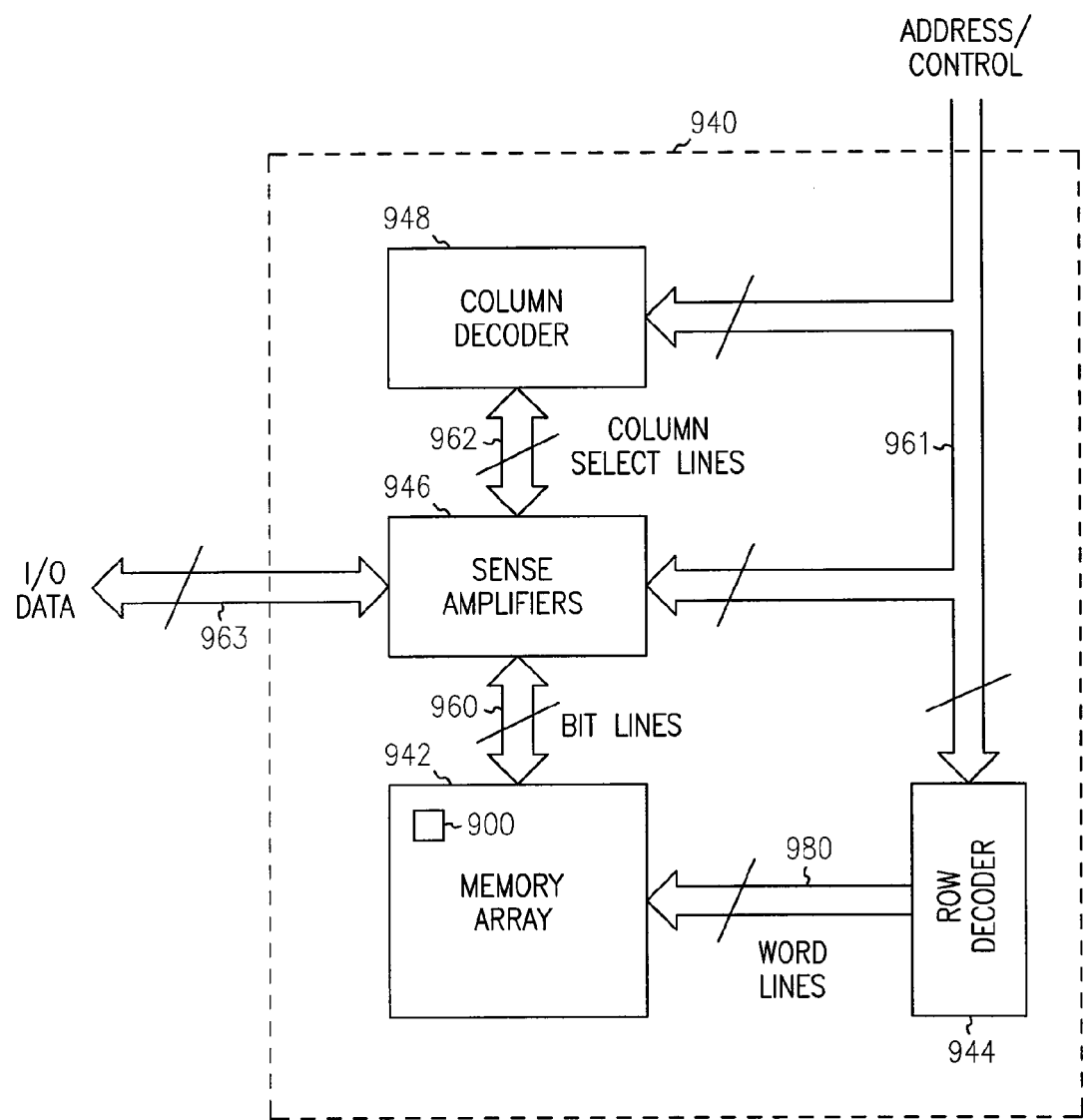
FIG. 9 illustrates an embodiment of a memory device according to the teachings of the present invention.

In FIG. 9 a memory device is illustrated according to the teachings of the present invention. The memory device 940 contains a memory array 942, row and column decoders 944, 948 and a sense amplifier circuit 946. The memory array 942 consists of a plurality of transistor cells 900, having oxide insulator nanolaminate layers in the gate stack, whose word lines 980 and bit lines 960 are commonly arranged into rows and columns, respectively. The bit lines 960 of the memory array 942 are connected to the sense amplifier circuit 946, while its word lines 980 are connected to the row decoder 944. Address and control signals are input on address/control lines 961 into the memory device 940 and connected to the column decoder 948, sense amplifier circuit 946 and row decoder 944 and are used to gain read and write access, among other things, to the memory array 942.

The column decoder 948 is connected to the sense amplifier circuit 946 via control and column select signals on column select lines 962. The sense amplifier circuit 946 receives input data destined for the memory array 942 and outputs data read from the memory array 942 over input/output (I/O) data lines 963. Data is read from the cells of the memory array 942 by activating a word line 980 (via the row decoder 944), which couples all of the memory cells corresponding to that word line to respective bit lines 960, which define the columns of the array. One or more bit lines 960 are also activated. When a particular word line 980 and bit lines 960 are activated, the sense amplifier circuit 946 connected to a bit line column detects and amplifies the conduction sensed through a given transistor cell and transferred to its bit line 960 by measuring the potential difference between the activated bit line 960 and a reference line which may be an inactive bit line. Again, in the read operation the source region of a given cell is couple to a grounded sourceline or array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 10:
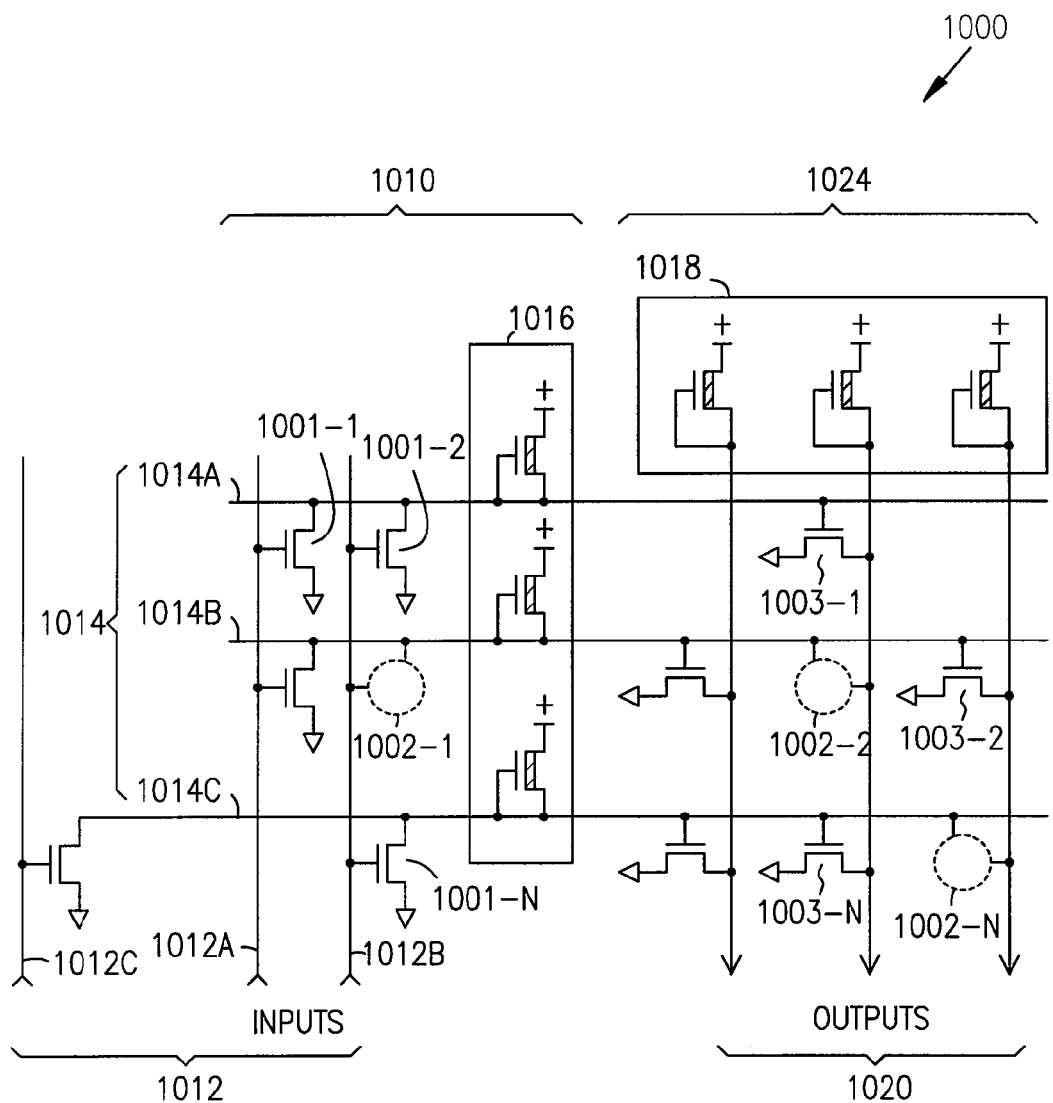
FIG. 10 is a schematic diagram illustrating a conventional NOR-NOR programmable logic array.

FIG. 10 shows a conventional NOR-NOR logic array 1000 which is programmable at the gate mask level by either fabricating a thin oxide gate transistor, e.g. logic cells 1001-1, 1001-2, . . . , 1001-N and 1003-1, 1003-2, . . . , 1003-N, at the intersection of lines in the array or not fabricating a thin oxide gate transistor, e.g. missing thin oxide transistors, 1002-1, 1002-2, . . . , 1002-N, at such an intersection. As one of ordinary skill in the art will understand upon reading this disclosure, the same technique is conventionally used to form other types of logic arrays not shown. As shown in FIG. 10, a number of depletion mode NMOS transistors, 1016 and 1018 respectively, are used as load devices.

The conventional logic array shown in FIG. 10 includes a first logic plane 1010 which receives a number of input signals at input lines 1012. In this example, no inverters are provided for generating complements of the input signals. However, first logic plane 1010 can include inverters to produce the complementary signals when needed in a specific application.

First logic plane 1010 includes a number of thin oxide gate transistors, e.g. transistors 1001-1, 1001-2, . . . , 1001-N. The thin oxide gate transistors, 1001-1, 1001-2, . . . , 1001-N, are located at the intersection of input lines 1012, and interconnect lines 1014. In the conventional PLA of FIG. 10, this selective fabrication of thin oxide gate transistor, e.g. transistors 1001-1, 1001-2, . . . , 1001-N, is referred to as programming since the logical function implemented by the programmable logic array is entered into the array by the selective arrangement of the thin oxide gate transistors, or logic cells, 1001-1, 1001-2, . . . , 1001-N, at the intersections of input lines 1012, and interconnect lines 1014 in the array.

In this embodiment, each of the interconnect lines 1014 acts as a NOR gate for the input lines 1012 that are connected to the interconnect lines 1014 through the thin oxide gate transistors, 1001-1, 1001-2, . . . , 1001-N, of the array. For example, interconnection line 1014A acts as a NOR gate for the signals on input lines 1012A and 1012B. That is, interconnect line 1014A is maintained at a high potential unless one or more of the thin oxide gate transistors, 1001-1, 1001-2, . . . , 1001-N, that are coupled to interconnect line 1014A are turned on by a high logic level signal on one of the input lines 1012. When a control gate address is activated, through input lines 1012, each thin oxide gate transistor, e.g. transistors 1001-1, 1001-2, . . . , 1001-N, conducts which performs the NOR positive logic circuit function, an inversion of the OR circuit function results from inversion of data onto the interconnect lines 1014 through the thin oxide gate transistors, 1001-1, 1001-2, . . . , 1001-N, of the array.

As shown in FIG. 10, a second logic plane 1024 is provided which includes a number of thin oxide gate transistor, e.g. transistors 1003-1, 1003-2, . . . , 1003-N. The thin oxide gate transistors, 1003-1, 1003-2, . . . , 1003-N, are located at the intersection of interconnect lines 1014, and output lines 1020. Here again, the logical function of the second logic plane 1024 is implemented by the selective arrangement of the thin oxide gate transistors, 1003-1, 1003-2, . . . , 1003-N, at the intersections of interconnect lines 1014, and output lines 1020 in the second logic plane 1024. The second logic plane 1024 is also configured such that the output lines 1020 comprise a logical NOR function of the signals from the interconnection lines 1014 that are coupled to particular output lines 1020 through the thin oxide gate transistors, 1003-1, 1003-2, . . . , 1003-N, of the second logic plane 1024. Thus, in FIG. 10, the incoming signals on each line are used to drive the gates of transistors in the NOR logic array as the same is known by one of ordinary skill in the art and will be understood by reading this disclosure.

Figure 11:
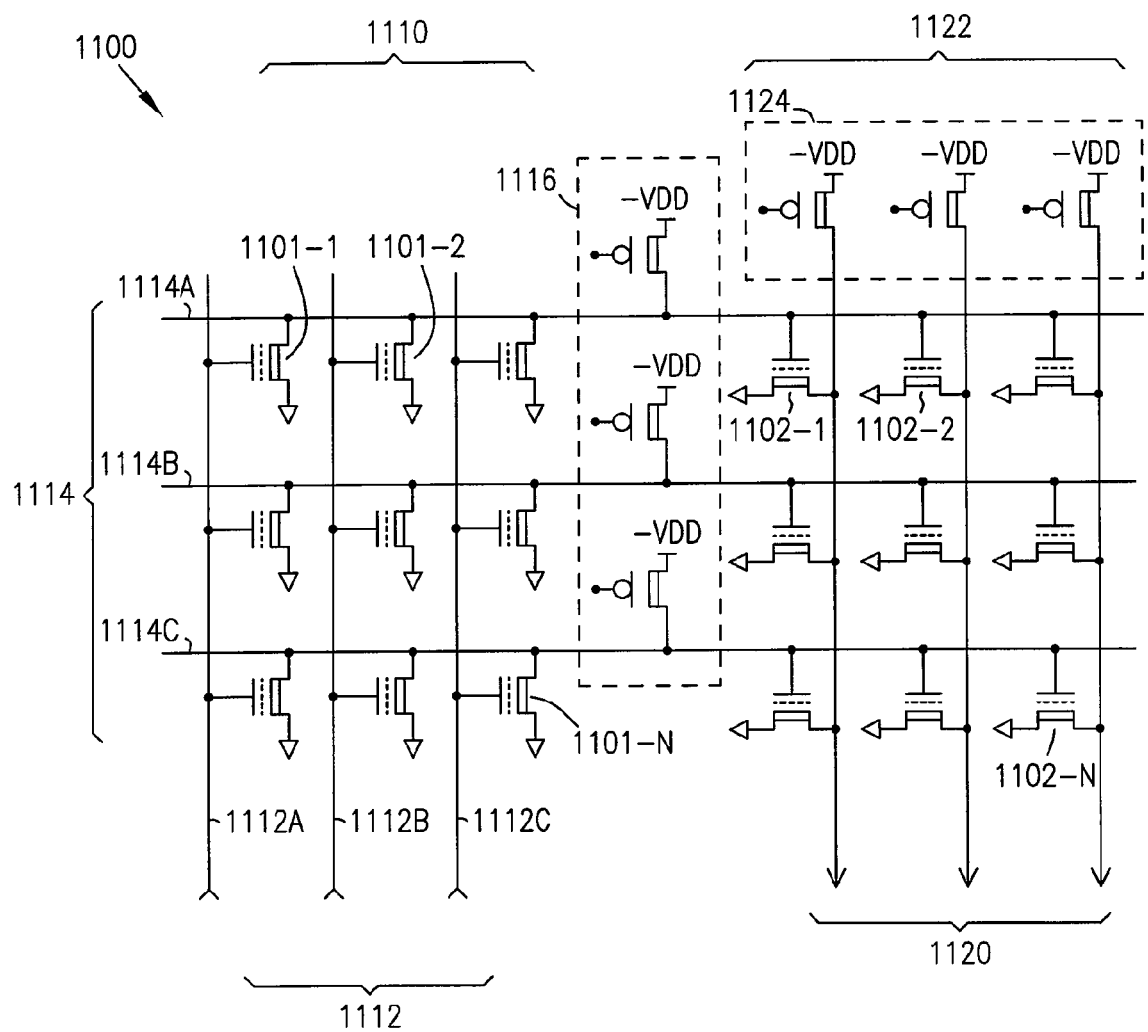
FIG. 11 is a schematic diagram illustrating generally an architecture of one embodiment of a programmable logic array (PLA) with logic cells, having oxide insulator nanolaminate layers according to the teachings of the present invention.

FIG. 11 illustrates an embodiment of a novel in-service programmable logic array (PLA) formed with logic cells having a gate structure with oxide insulator nanolaminate layers, according to the teachings of the present invention. In FIG. 11, PLA 1100 implements an illustrative logical function using a two level logic approach. Specifically, PLA 1100 includes first and second logic planes 1110 and 1122. In this example, the logic function is implemented using NOR-NOR logic. As shown in FIG. 11, first and second logic planes 1110 and 1122 each include an array of, logic cells, having a gate structure with oxide insulator nanolaminate layers, which serve as driver transistors, 1101-1, 1101-2, . . . , 1101-N, and 1102-1, 1102-2, . . . , 1102-N respectively, formed according to the teachings of the present invention. The driver transistors, 1101-1, 1101-2, . . . , 1101-N, and 1102-1, 1102-2, . . . , 1102-N, have their first source/drain regions coupled to source lines or a conductive source plane. These driver transistors, 1101-1, 1101-2, . . . , 1101-N, and 1102-1, 1102-2, . . . , 1102-N are configured to implement the logical function of FPLA 1100. The driver transistors, 1101-1, 1101-2, . . . , 1101-N, and 1102-1, 1102-2, . . . , 1102-N are shown as n-channel transistors. However, the invention is not so limited. Also, as shown in FIG. 11, a number of p-channel metal oxide semiconductor (PMOS) transistors are provided as load device transistors, 1116 and 1124 respectively, having their source regions coupled to a voltage potential (VDD). These load device transistors, 1116 and 1124 respectively, operate in complement to the driver transistors, 1101-1, 1101-2, . . . , 1101-N, and 1102-1, 1102-2, . . . , 1102-N to form load inverters.

It is noted that the configuration of FIG. 11 is provided by way of example and not by way of limitation. Specifically, the teachings of the present application are not limited to programmable logic arrays in the NOR-NOR approach. Further, the teachings of the present application are not limited to the specific logical function shown in FIG. 11. Other logical functions can be implemented in a programmable logic array, with the driver transistors, having a gate structure with oxide insulator nanolaminate layers, 1101-1, 1101-2, . . . , 1101-N, and 1102-1, 1102-2, . . . , 1102-N and load device transistors, 1116 and 1124 respectively, of the present invention, using any one of the various two level logic approaches.

First logic plane 1110 receives a number of input signals at input lines 1112. In this example, no inverters are provided for generating complements of the input signals. However, first logic plane 1110 can include inverters to produce the complementary signals when needed in a specific application.

First logic plane 1110 includes a number of driver transistors, having a gate structure with oxide insulator nanolaminate layers, 1101-1, 1101-2, ..., 1101-N, that form an array. The driver transistors, 1101-1, 1101-2, ..., 1101-N, are located at the intersection of input lines 1112, and interconnect lines 1114. Not all of the driver transistors, 1101-1, 1101-2, ..., 1101-N, are operatively conductive in the first logic plane. Rather, the driver transistors, 1101-1, 1101-2, ..., 1101-N, are selectively programmed, as has been described herein, to respond to the input lines 1112 and change the potential of the interconnect lines 1114 so as to implement a desired logic function. This selective interconnection is referred to as programming since the logical function implemented by the programmable logic array is entered into the array by the driver transistors, 1101-1, 1101-2, ..., 1101-N, that are used at the intersections of input lines 1112, and interconnect lines 1114 in the array.

In this embodiment, each of the interconnect lines 1114 acts as a NOR gate for the input lines 1112 that are connected to the interconnect lines 1114 through the driver transistors, 1101-1, 1101-2, ..., 1101-N, of the array 1100. For example, interconnection line 1114A acts as a NOR gate for the signals on input lines 1112A, 1112B and 1112C. Programmability of the driver transistors, 1101-1, 1101-2, ..., 1101-N is achieved by trapping charge carriers in potential wells in the oxide insulator nanolaminate layers of the gate stack, as described herein. When the oxide insulator nanolaminate layers are charged, that driver transistor, 1101-1, 1101-2, ..., 1101-N will remain in an off state until it is reprogrammed. Applying and removing a charge to the oxide insulator nanolaminate layers, is performed by tunneling charge into the oxide insulator nanolaminate layers of the driver transistors, 1101-1, 1101-2, ..., 1101-N. A driver transistors, 1101-1, 1101-2, ..., 1101-N programmed in an off state remains in that state until the charge is removed from the oxide insulator nanolaminate layers.

Driver transistors, 1101-1, 1101-2, ..., 1101-N not having their corresponding gate structure with oxide insulator nanolaminate layers charged operate in either an on state or an off state, wherein input signals received by the input lines 1112A, 1112B and 1112C determine the applicable state. If any of the input lines 1112A, 1112B and 1112C are turned on by input signals received by the input lines 1112A, 1112B and 1112C, then a ground is provided to load device transistors 1116. The load device transistors 1116 are attached to the interconnect lines 1114. The load device transistors 1116 provide a low voltage level when any one of the driver transistors, 1101-1, 1101-2, ..., 1101-N connected to the corresponding interconnect line 1114 is activated. This performs the NOR logic circuit function, an inversion of the OR circuit function results from inversion of data onto the interconnect lines 1114 through the driver transistors, 1101-1, 1101-2, ..., 1101-N of the array 1100. When the driver transistors, 1101-1, 1101-2, ..., 1101-N are in an off state, an open is provided to the drain of the load device transistors 1116. The VDD voltage level is applied to corresponding input lines, e.g. the interconnect lines 1114 for second logic plane 1122 when a load device transistors 1116 is turned on by a clock signal received at the gate of the load device transistors 1116. Each of the driver transistors, 1101-1, 1101-2, ..., 1101-N described herein are formed according to the teachings of the present, having a gate structure with oxide insulator nanolaminate layers.

In a similar manner, second logic plane 1122 comprises a second array of driver transistors, 1102-1, 1102-2, ..., 1102-N that are selectively programmed to provide the second level of the two level logic needed to implement a specific logical function. In this embodiment, the array of driver transistors, 1102-1, 1102-2, ..., 1102-N is also configured such that the output lines 1120 comprise a logical NOR function of the signals from the interconnection lines 1114 that are coupled to particular output lines 1120 through the driver transistors, 1102-1, 1102-2, ..., 1102-N of the second logic plane 1122.

Programmability of the driver transistors, 1102-1, 1102-2, ..., 1102-N is achieved by trapping charge carriers in potential wells in the oxide insulator nanolaminate layers of the gate stack, as described herein. When the oxide insulator nanolaminate layers are charged, that driver transistor, 1102-1, 1102-2, ..., 1102-N will remain in an off state until it is reprogrammed. Applying and removing a charge to the oxide insulator nanolaminate layers are performed by tunneling charge into the oxide insulator nanolaminate layers of the driver transistors, 1101-1, 1101-2, ..., 1101-N. A driver transistor, e.g. 1102-1, 1102-2, ..., 1102-N, programmed in an off state remains in that state until the charge is removed from the oxide insulator nanolaminate layers.

Driver transistors, 1102-1, 1102-2, ..., 1102-N not having their corresponding gate structure with oxide insulator nanolaminate layers charged operate in either an on state or an off state, wherein signals received by the interconnect lines 1114 determine the applicable state. If any of the interconnect lines 1114 are turned on, then a ground is provided to load device transistors 1124 by applying a ground potential to the source line or conductive source plane coupled to the transistors first source/drain region as described herein. The load device transistors 1124 are attached to the output lines 1120. The load device transistors 1124 provide a low voltage level when any one of the driver transistors, 1102-1, 1102-2, ..., 1102-N connected to the corresponding output line is activated. This performs the NOR logic circuit function, an inversion of the OR circuit function results from inversion of data onto the output lines 1120 through the driver transistors, 1102-1, 1102-2, ..., 1102-N of the array 1100. When the driver transistors, 1102-1, 1102-2, ..., 1102-N are in an off state, an open is provided to the drain of the load device transistors 1124. The VDD voltage level is applied to corresponding output lines 1120 for second logic plane 1122 when a load device transistor 1124 is turned on by a clock signal received at the gate of the load device transistors 1124. In this manner a NOR-NOR electrically programmable logic array is most easily implemented utilizing the normal PLA array structure. Each of the driver transistors, 1102-1, 1102-2, ..., 1102-N described herein are formed according to the teachings of the present, having a gate structure with oxide insulator nanolaminate layers.

Thus FIG. 11 shows an embodiment for the application of the novel transistor cells, having a gate structure with oxide insulator nanolaminate layers, in a logic array. If a driver transistors, 1101-1, 1101-2, ..., 1101-N, and 1102-1, 1102-2, ..., 1102-N, is programmed with a negative charge trapped in potential wells, formed with the oxide insulator nanolaminate layers, it is effectively removed from the array. In this manner the array logic functions can be programmed even when the circuit is in the final circuit or in the field and being used in a system.

The absence or presence of charge trapped in potential wells, formed by the oxide insulator nanolaminate layers, is read by addressing the input lines 1112 or control gate lines and y-column/sourcelines to form a coincidence in address at a particular logic cell. The control gate line would for instance be driven positive at some voltage of 1.0 Volts and the y-column/sourceline grounded, if the oxide insulator nanolaminate layers are not charged with electrons then the transistor would turn on tending to hold the interconnect line on that particular row down indicating the presence of a stored "one" in the cell. If this particular transistor cell has charge trapped in potential wells, formed by the oxide insulator nanolaminate layers, the transistor will not turn on and the presence of a stored "zero" is indicated in the cell. In this manner, data stored on a particular transistor cell can be read.

Programming can be achieved by hot electron injection. In this case, the interconnect lines, coupled to the second source/drain region for the transistor cells in the first logic plane, are driven with a higher drain voltage like 2 Volts for 0.1 micron technology and the control gate line is addressed by some nominal voltage in the range of twice this value. Erasure is accomplished by driving the control gate line with a large positive voltage and the sourceline and/or backgate or substrate/well address line of the transistor with a negative bias so the total voltage difference is in the order of 3 Volts causing electrons to tunnel out of the oxide insulator nanolaminate layers of the driver transistors. Writing can be performed, as also described above, by normal channel hot electron injection One of ordinary skill in the art will appreciate upon reading this disclosure that a number of different configurations for the spatial relationship, or orientation of the input lines 1112, interconnect lines 1114, and output lines 1120 are possible.

Figure 12:
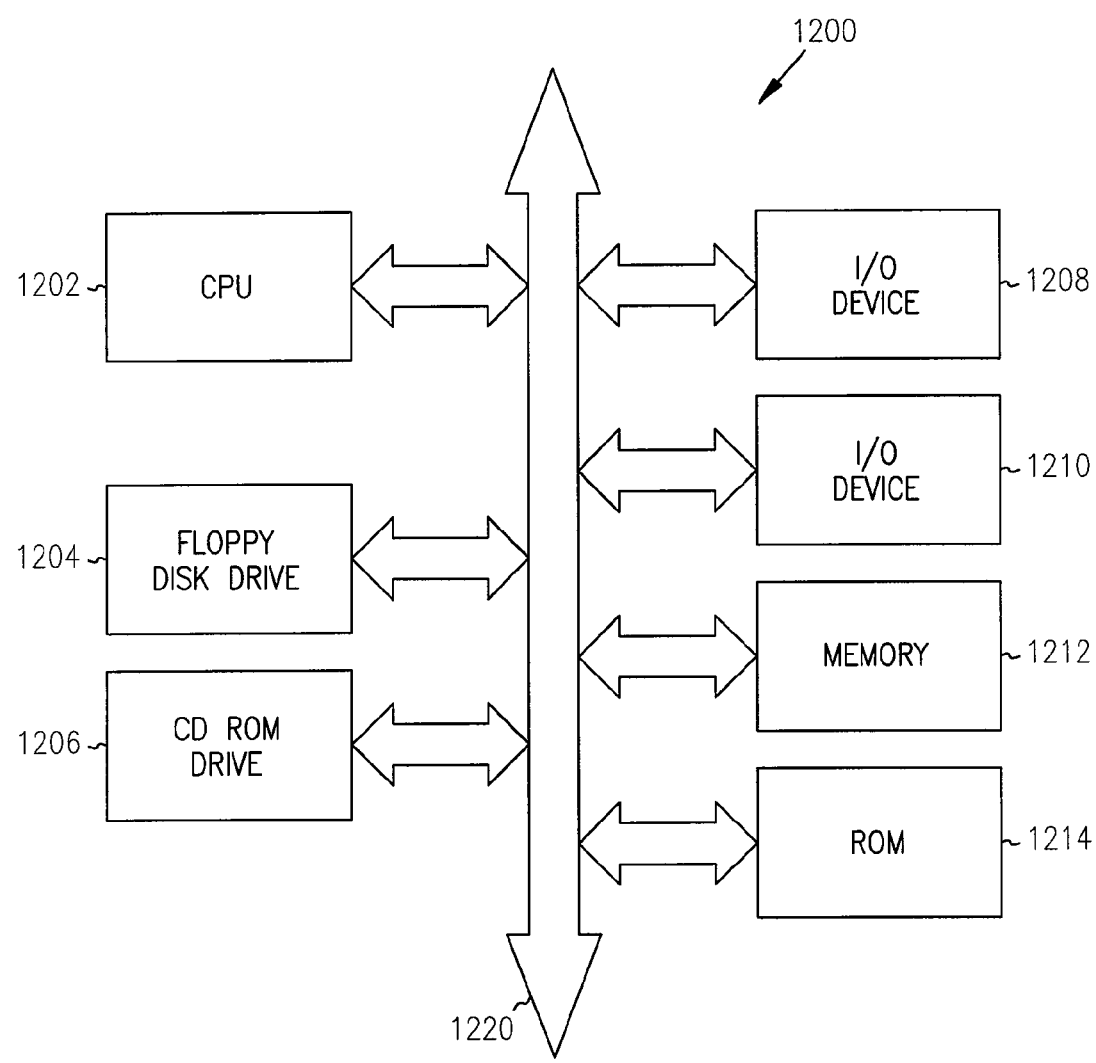
FIG. 12 is a block diagram of an electrical system, or processor-based system, utilizing oxide nanolaminates constructed in accordance with the present invention.

FIG. 12 is a block diagram of an electrical system, or processor-based system, 1200 utilizing transistor cells with a gate structure having oxide insulator nanolaminate layers. By way of example and not by way of limitation, memory 1212 is constructed in accordance with the present invention to have transistor cells with a gate structure having oxide insulator nanolaminate layers. The same applies to transistors in the CPU, etc., the invention is not so limited. The processor-based system 1200 may be a computer system, a process control system or any other system employing a processor and associated memory. The system 1200 includes a central processing unit (CPU) 1202, e.g., a microprocessor, that communicates with the NOR flash memory 1212 and an I/O device 1208 over a bus 1220. It must be noted that the bus 1220 may be a series of buses and bridges commonly used in a processor-based system, but for convenience purposes only, the bus 1220 has been illustrated as a single bus. A second I/O device 1210 is illustrated, but is not necessary to practice the invention. The processor-based system 1200 can also includes read-only memory (ROM) 1214 and may include peripheral devices such as a floppy disk drive 1204 and a compact disk (CD) ROM drive 1206 that also communicates with the CPU 1202 over the bus 1220 as is well known in the art.

It will be appreciated by those skilled in the art that additional circuitry and control signals can be provided, and that the memory device 1200 has been simplified to help focus on the invention. In one embodiment, at least one of the transistor cells, having a gate structure with oxide insulator nanolaminate layers in memory 1212 includes a programmed transistor cell according to the teachings of the present invention.

It will be understood that the embodiment shown in FIG. 12 illustrates an embodiment for electronic system circuitry in which the novel transistor cells of the present invention are used. The illustration of system 1200, as shown in FIG. 12, is intended to provide a general understanding of one application for the structure and circuitry of the present invention, and is not intended to serve as a complete description of all the elements and features of an electronic system using the novel transistor cell structures. Further, the invention is equally applicable to any size and type of memory device 1200 using the novel transistor cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel transistor cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

This disclosure describes the use of oxide insulator nanolaminate layers with charge trapping in potential wells formed by the different electron affinities of the insulator layers. Two different types of materials are used for the nanolaminated insulator layers. The two different types of materials are transition metal oxides and silicon oxycarbide. In the case of transition metal oxide layers, these are formed by ALD and have atomic dimensions, or nanolaminates, with precisely controlled interfaces and layer thickness. In the case of silicon oxycarbide, these are deposited using chemical vapor deposition techniques since an ALD process has not yet been developed. The gate insulator structure embodiments of the present invention, having silicon oxide-metal oxide-silicon oxide insulator nanolaminates, are employed in a wide variety of different device applications.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A transistor, comprising:
    a first source/drain region;
    a second source/drain region;
    a channel region between the first and the second source/drain regions, and a gate separated from the channel region by a multilayer gate insulator; and
    wherein the multilayer gate insulator includes oxide insulator nanolaminate layers, wherein at least one charge trapping layer is a substantially amorphous metal oxide.

2. The transistor of claim 1, wherein the charge trapping layer includes a transition metal oxide.

3. The transistor of claim 1, wherein the oxide insulator nanolaminate layers include hafnium oxide.

4. A vertical memory cell, comprising:
    a vertical transistor extending outwardly from a substrate, the vertical transistor having a source region, a drain region, a channel region between the source region and the drain region, and a gate separated from the channel region by a multilayer gate insulator wherein the multilayer gate insulator includes oxide insulator nanolaminate layers, wherein at least one charge trapping layer is a substantially amorphous transition metal oxide;

a control line coupled to the gate;

a first transmission line formed in a trench adjacent to the vertical transistor, wherein the source region is coupled to the first transmission line; and a second transmission line coupled to the drain region.

5. The memory cell of claim 4, wherein the insulator nanolaminate layers including transition metal oxides are formed by atomic layer deposition (ALD).

6. The memory cell of claim 4, wherein the gate insulator has a thickness of approximately 10 nanometers (nm).

7. A vertical memory cell, comprising:

a vertical transistor extending outwardly from a substrate, the vertical transistor having a source region, a drain region, a channel region between the source region and the drain region, and a gate separated from the channel region by a multilayer gate insulator wherein the multilayer gate insulator includes nanolaminate charge trapping layers, wherein at least one charge trapping layer is a substantially amorphous metal oxide, at least one nanolaminate layer formed using atomic layer deposition techniques;

a control line coupled to the gate;

a first transmission line formed in a trench adjacent to the vertical transistor, wherein the source region is coupled to the first transmission line; and a second transmission line coupled to the drain region.

8. The memory cell of claim 7, wherein the nanolaminate charge trapping layers includes zirconium oxide.

9. A transistor array, comprising:

a number of transistor cells formed on a substrate, wherein each transistor cell includes a first source/drain region, a second source/drain region, a channel region between the first and the second source/drain regions, and a gate separated from the channel region by a multilayer gate insulator, and wherein the multilayer gate insulator includes oxide insulator nanolaminate layers, wherein at least one charge trapping layer is a substantially amorphous metal oxide;

a number of bit lines coupled to the second source/drain region of each transistor cell along rows of the transistor array;

a number of control lines coupled to the gate of each transistor cell along columns of the transistor array; and a number of first transmission lines, wherein the first source/drain region of each transistor cell is coupled to the number of first transmission lines along rows of the transistor cells.

10. The transistor array of claim 9, wherein the insulator nanolaminate layers include transition metal oxides.

11. The transistor array of claim 9, wherein the gate insulator of each transistor cell has a thickness of approximately 10 nanometers (nm).

12. A method for forming a transistor device, comprising:

forming a first source/drain region, a second source/drain region, and a channel region therebetween in a substrate;

forming a multilayer gate insulator opposing the channel region, wherein forming the multilayer gate insulator includes forming a plurality of monolayers, including a charge trapping layer, using atomic layer deposition, wherein the charge trapping layer is a substantially amorphous metal oxide; and forming a gate over the multilayer gate insulator.

13. The method of claim 12, wherein forming the plurality of monolayers includes forming the charge trapping layer from a transition metal oxide.

14. The method of claim 12, wherein forming oxide insulator nanolaminate layers includes forming titanium oxide layers.

15. A vertical memory cell, comprising:

a vertical transistor extending outwardly from a substrate, the vertical transistor having a first source/drain region, a second source/drain region, a channel region between the first and the second source/drain regions, and a gate separated from the channel region by a multilayer gate insulator, wherein the multilayer gate insulator includes at least one amorphous metal oxide charge trapping nanolaminate layer formed using atomic layer deposition techniques;

a first transmission line coupled to the first source/drain region; and a second transmission line coupled to the second source/drain region.

16. The vertical memory cell of claim 15, wherein the charge trapping nanolaminate layer includes transition metal oxides.

17. The vertical memory cell of claim 15, wherein the charge trapping nanolaminate layer includes tantalum oxide.

18. The vertical memory cell of claim 15, wherein the multilayer gate insulator has a thickness of approximately 10 nanometers (nm).

* * * * *